United States Patent
Brody

(10) Patent No.: US 7,538,828 B2
(45) Date of Patent: May 26, 2009

(54) SHADOW MASK DEPOSITION SYSTEM FOR AND METHOD OF FORMING A HIGH RESOLUTION ACTIVE MATRIX LIQUID CRYSTAL DISPLAY (LCD) AND PIXEL STRUCTURES FORMED THEREWITH

(75) Inventor: Thomas P. Brody, Pittsburgh, PA (US)

(73) Assignee: Advantech Global, Ltd, Road Town, Tortola (VG)

( * ) Notice: Subject to any disclaimer, the term of this patent is extended or adjusted under 35 U.S.C. 154(b) by 551 days.

(21) Appl. No.: 11/032,416

(22) Filed: Jan. 10, 2005

(65) Prior Publication Data
US 2006/0152641 A1    Jul. 13, 2006

(51) Int. Cl.
G02F 1/1343    (2006.01)

(52) U.S. Cl. .......................... 349/38; 349/39; 349/139; 257/59; 257/72

(58) Field of Classification Search ................ 349/38, 349/39
See application file for complete search history.

(56) References Cited

U.S. PATENT DOCUMENTS

| | | | |
|---|---|---|---|
| 5,286,983 A * | 2/1994 | Sakamoto et al. ............. | 257/59 |
| 5,703,668 A | 12/1997 | Shin | |
| 5,831,708 A * | 11/1998 | Hiraishi et al. ............... | 349/143 |
| 5,892,563 A * | 4/1999 | Ono et al. ..................... | 349/143 |
| 5,917,563 A * | 6/1999 | Matsushima .................. | 349/38 |
| 6,300,174 B1 | 10/2001 | Bae | |
| 6,524,895 B2 | 2/2003 | Yamazaki et al. | |
| 6,544,809 B2 | 4/2003 | Lim | |
| 6,777,716 B1 | 8/2004 | Yamazaki et al. | |
| 6,894,736 B2 * | 5/2005 | Battersby et al. .............. | 349/42 |
| 2001/0023085 A1 | 9/2001 | Lim | |

* cited by examiner

*Primary Examiner*—Michael H Caley
(74) *Attorney, Agent, or Firm*—The Webb Law Firm

(57) ABSTRACT

An LCD pixel includes a first conductive segment connected to a first bus, a first insulator segment on the first conductive segment, a second conductive segment on the first insulator segment, a liquid crystal material on the second conductive segment, a third conductive segment on the liquid crystal material, and a thin film transistor having a control terminal, a first power terminal and second power terminal connected to a second bus, a third bus and the second conductive segment, respectively. In response to application of a suitable signal on the second bus when reference voltages are present on the first bus and on the third conductive segment, and a voltage is applied to the third bus, the thin film transistor is operative for charging a capacitor formed by the first conductive segment, the first insulator segment and the second conductive segment and for activating the liquid crystal material.

18 Claims, 26 Drawing Sheets

SHADOW MASK DEPOSITION SYSTEM FOR AND METHOD OF FORMING A HIGH RESOLUTION ACTIVE MATRIX LIQUID CRYSTAL DISPLAY (LCD) AND PIXEL STRUCTURES FORMED THEREWITH

BACKGROUND OF THE INVENTION

1. Field Of The Invention

The present invention relates to liquid crystal displays (LCDs) and, more particularly, to forming a high resolution active matrix LCD by a shadow mask deposition process.

2. Description Of Related Art

Active matrix backplanes are widely used in flat panel displays, such as LCDs, for routing signals to pixels of the display in order to produce viewable pictures. Presently, such active matrix backplanes are formed by use of a photolithography manufacturing process, which has been driven in the market by the demand for higher and higher resolution displays which are not otherwise possible with other manufacturing processes. Photolithography is a pattern definition technique that uses electromagnetic radiation, such as ultraviolet (UV) radiation, to expose a layer of resist that is deposited on the surface of a substrate. Exemplary photolithography processing steps to produce an active matrix backplane include coat photoresist, pre-bake, soak, bake, align/expose, develop, rinse, bake, deposit layer, lift off photoresist, scrub/rinse and dry. As can be seen, the active matrix backplane fabrication process includes numerous deposition and etching steps in order to define appropriate patterns of the backplane. Because of the number of steps required to form an active matrix backplane by use of the photolithography manufacturing process, foundries of adequate capacity for volume production of backplanes are very expensive.

A shadow mask deposition process is well known and has been used for years in microelectronics manufacturing. The shadow mask deposition process is a significantly less costly and less complex manufacturing process, compared to the photolithography process. However, the resolution achievable via the shadow mask deposition process is limited. Today's shadow mask manufacturing techniques are limited to forming, for example, up to 80 pixels per inch (ppi), which is representative of, for example, a typical laptop display resolution. However, for small displays, such as those in mobile phones and PDAs, a much higher resolution, on the order of 200 to 300 ppi, is desired. Because of this demand for higher resolution, active matrix backplane manufacturers have migrated away from the less costly and less complex shadow mask deposition process in favor of the photolithography process, but at the tradeoff of cost and complexity.

Furthermore, the shadow mask deposition process has other certain limitations that are well recognized in the industry. For example, the minimum aperture size and aperture spacing that can be produced accurately within a shadow mask is dependent on several factors, such as the thickness of the shadow mask and the overall area of the shadow mask, as is well known by those skilled in the art. The aperture size and aperture spacing also affects the overall strength and structural integrity of a shadow mask.

Therefore, what is needed is a way to provide a high resolution display, in particular a high resolution LCD, by use of the more cost-effective shadow mask deposition process, rather than by use of the complex and expensive photolithography process. What is also needed is a way to form a high resolution LCD by use of a shadow mask deposition process, while maintaining a minimum size and spacing of the apertures in the shadow mask(s) at a practical dimension.

SUMMARY OF THE INVENTION

The invention is an LCD pixel formed from an array of LCD sub-pixels. Each LCD sub-pixel includes a capacitor formed of a stack of a pair of first conductors electrically isolated from each other by a first insulator. Each LCD sub-pixel also includes a transistor formed from a pair of spaced second conductors, one of which is in contact with one of the first conductors, a semiconductor material extending in contact between the pair of second conductors, a second insulator atop the semiconductor material and a third conductor atop the second insulator. A liquid crystal material is disposed atop the one first conductor and a fourth conductor is disposed atop the liquid crystal material.

The LCD pixel can include a substrate formed from an insulator. At least a portion of each of (i) the other of the first conductors, (ii) the second conductors and (iii) the semiconductor material can be disposed on the substrate. Desirably, the substrate is transparent.

Each insulator can be formed of a transparent, electrically non-conductive material and each first conductor can be formed of a transparent, electrically conductive material. More specifically, each insulator can be formed of aluminum oxide ($Al_2O_3$) or silicon dioxide ($SiO_2$), each first conductor can be formed of indium-tin oxide (ITO) and each conductor, other than each first conductor, can be formed of copper (Cu), nickel (Ni), chromium (Cr) or aluminum (Al).

The LCD pixel can further include a pair of spaced first conductive busses. The third conductor can be connected to one of said pair of first busses and the other first conductor can be connected to the other of said pair of first busses.

The LCD pixel can further include a second conductive bus disposed transverse to the pair of first busses and electrically isolated therefrom by the second insulator. The other second conductor can be connected to the second conductive bus.

The invention is also a method of forming an LCD pixel. The method includes (a) forming a capacitor comprised of a deposit of a first conductor, a deposit of a first insulator on the first conductor and a deposit of a second conductor on the first insulator; (b) depositing semiconductor material in spaced relation to the capacitor; (c) depositing a third conductor in a manner to form a connection between the second conductor and a first portion of the semiconductor material and to form at least part of a first bus that is connected to a second portion of the semiconductor material but not to the first portion of the semiconductor material; (d) depositing a second insulator on the semiconductor material and on the first bus; and (e) depositing a fourth conductor on the second insulator, the deposited fourth conductor forming at least part of a second bus.

The method can further include (f) depositing a liquid crystal material on the second conductor; and (g) depositing a fifth conductor on the liquid crystal material.

The third conductor can be comprised of a first metal segment that connects the first portion of the semiconductor material and the second conductor and a second metal segment that defines the at least part of a first bus that is connected to a second portion of the semiconductor material. The fourth conductor can be comprised of a third metal segment.

The first bus can be further comprised of a fourth metal segment in contact with the second metal segment. The second bus can be further comprised of a fifth metal segment in contact with the third metal segment.

The first and second conductors can each be formed from a first conductive material. The first and second insulators can each be formed from the same insulator material. The third and fourth conductors can each be formed from a second conductive material.

The first conductive material can be indium-tin oxide (ITO). The insulator material can be aluminum oxide ($Al_2O_3$) or silicon dioxide ($SiO_2$). The second conductive material can be copper (Cu), nickel (Ni), chromium (Cr) or aluminum (Al).

The invention is also an LCD pixel comprising a capacitor formed on an insulating substrate. The capacitor includes a first conductive segment on the substrate, a first insulator segment on the first conductive segment and a second conductive segment on the first insulator segment. The LCD pixel also comprises a transistor formed on the substrate. The transistor includes a semiconductor material segment on the substrate, a third conductive segment connecting a first part of the semiconductor material segment to the second conductive segment, a fourth conductive segment connected to a second part of the semiconductor material segment, a second insulator segment on the semiconductor material segment and a fifth conductive segment on the second insulator segment. A liquid crystal material is disposed on the second conductive segment and a sixth conductive segment is disposed on the liquid crystal material.

The LCD can further include a first bus connected to the fourth conductive segment and a second bus connected to the fifth conductive segment, wherein the first and second busses are electrically isolated from each other. Desirably, the first and second busses are electrically isolated from each other by the second insulator segment.

The LCD pixel can also include a third bus connected to the first conductive segment, wherein the third bus is parallel to the second bus and the third bus is electrically isolated from the first bus.

Lastly, the invention is an LCD pixel that includes a first conductive segment connected to a first bus; a first insulator segment on the first conductive segment; a second conductive segment on the first insulator segment; a liquid crystal material on the second conductive segment; a third conductive segment on the liquid crystal material; and a thin film transistor having a control terminal, a first power terminal and a second power terminal connected to a second bus, a third bus and the second conductive segment, respectively, wherein the first, second and third busses are electrically isolated from each other.

In response to application of a signal on the second bus in the presence of a first reference voltage on the first bus, a second reference voltage on the third conductive segment and an applied voltage on the third bus, the thin film transistor is operative for (i) charging a capacitor formed by the combination of the first conductive segment, the first insulator segment and the second conductive segment from the applied voltage on the third bus and (ii) for activating the liquid crystal material from the applied voltage on the third bus.

The first reference voltage can be a ground reference. The second reference voltage can be the ground reference. The applied voltage can be either a positive or negative voltage with respect to the ground reference. The signal can be either a positive or negative voltage pulse with respect to the ground reference.

DETAILED DESCRIPTION OF THE INVENTION

The present invention will be described with reference to the accompanying figures where like reference numbers correspond to like elements.

Figure 1A:
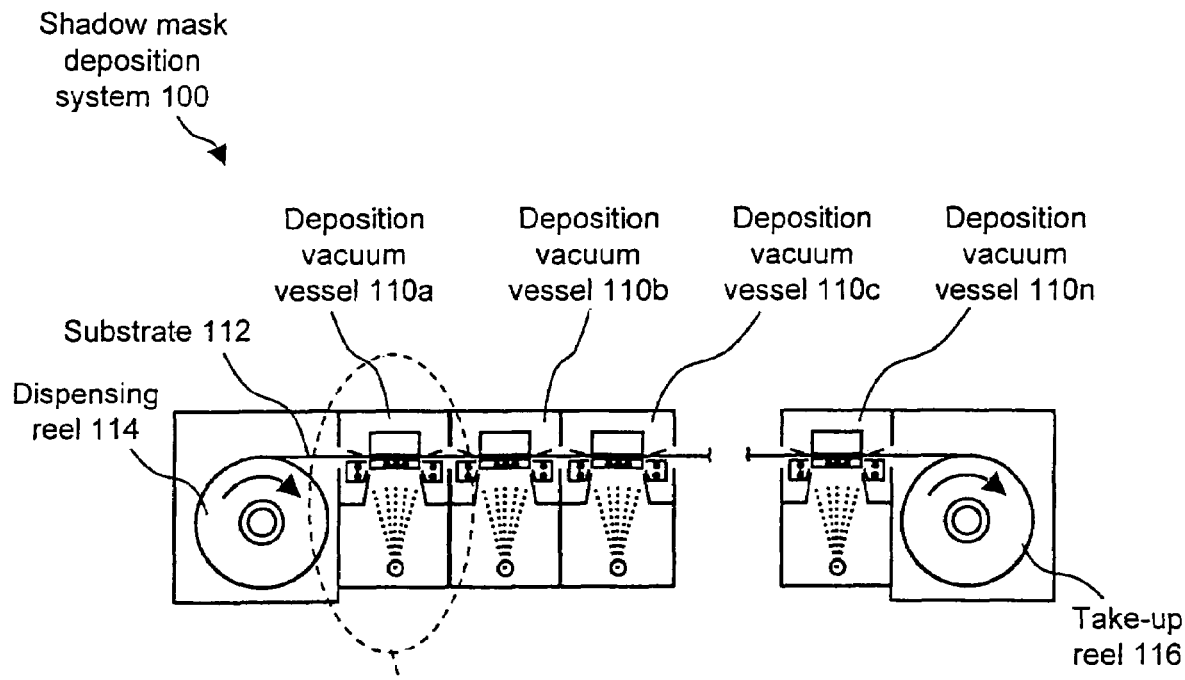
FIG. 1A is a diagrammatic illustration of a shadow mask deposition system for forming pixel structures of a high resolution active matrix LCD.
Figure 1B:
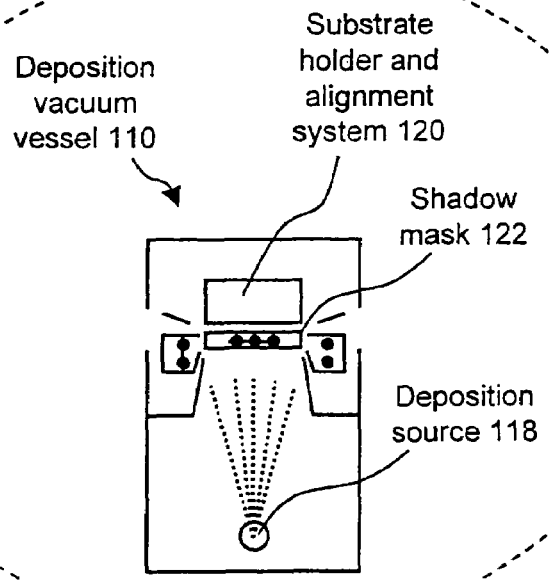
FIG. 1B is an enlarged view of a single deposition vacuum vessel of the shadow mask deposition system of FIG. 1A.

With reference to FIGS. 1A and 1B, a shadow mask deposition system 100 for forming LCD pixels of a high resolution active matrix LCD includes a plurality of deposition vacuum vessels 110 (e.g., deposition vacuum vessels 110a through 110n). The number and arrangement of deposition vacuum vessels 110 is dependent on the number of deposition events and etching events required for any given product formed therewith.

In use of shadow mask deposition system 100, a substrate 112 translates through the serially arranged deposition vacuum vessels 110 by use of a reel-to-reel mechanism that includes a dispensing reel 114 and a take-up reel 116.

Each deposition vacuum vessel 110 includes a deposition source 118, a substrate holder and alignment system 120 and a shadow mask 122. For example, deposition vacuum vessel 110a includes deposition source 118a, substrate holder and alignment system 120a and shadow mask 122a; deposition vacuum vessel 110b includes deposition source 118b, substrate holder and alignment system 120b and shadow mask 122b; deposition vacuum vessel 110c includes deposition source 118c, substrate holder and alignment system 120c and shadow mask 122c; and so forth, for any number of deposition vacuum vessels 110.

Deposition vacuum vessels 110 are arranged and connected in series. Each deposition source 118 is charged with a desired material to be deposited onto flexible substrate 112 through its associated shadow mask 122 which is held in intimate contact with the portion of substrate 112 in the corresponding deposition vacuum vessel 110.

An exemplary substrate holder and alignment system 120 is disclosed in U.S. patent application Ser. No. 10/971,218, filed Oct. 22, 2004, entitled, "Substrate-To-Mask Alignment And Securing System With Temperature Control For Use In An Automated Shadow Mask Vacuum Deposition Process" which is incorporated herein by reference (hereinafter "the '218 application). The '218 application discloses a substrate holder and alignment system 120 that includes a substrate arranged between a magnetic chuck assembly and a mask holder assembly. The magnetic chuck assembly includes a magnetic chuck, a thermoelectric device, a plurality of thermal sensors and a plurality of light sources. Substrate holder and alignment system 120 further includes a mask holder for holding a shadow mask 122, a motion control system and an optical alignment system. The ability to accurately align each shadow mask 122 to substrate 112 using substrate holder and alignment system 120 during each successive deposition event allows the formation of LCD pixel structures on a suitably small pitch to achieve a high resolution active matrix LCD in the manner described in greater detail hereinafter.

Each shadow mask 122 in shadow mask deposition system 100 includes a pattern of apertures (not shown), e.g., slots and holes. The pattern of apertures formed in each shadow mask 122 corresponds to a desired pattern of material to be deposited on substrate 112 from a corresponding deposition source 118 in a corresponding deposition vacuum vessel 110 as substrate 112 advances through shadow mask deposition system 100.

Each shadow mask 122 is formed of, for example, nickel, chromium, steel, copper, Kovar® or Invar®, and has a thickness of, for example, 150-200 microns. Kovar® and Invar® can be obtained from, for example, ESPICorp Inc. of Ashland, Oreg. In the United States, Kovar® is a registered trademark, Registration No. 337,962, currently owned by CRS Holdings, Inc. of Wilmington, Delaware, and Invar® is a registered trademark, Registration No. 63,970, currently owned by Imphy S.A. Corporation of France.

Those skilled in the art will appreciate that production system 100 may include additional stages (not shown), such as an anneal stage, a test stage, one or more cleaning stages, a cut and mount stage, and the like, as is well known. In addition, the number, purpose and arrangement of deposition vacuum vessels 110 can be modified, as needed, for depositing one or more materials required for a particular application by one of ordinary skill in the art. An exemplary production system 100 is disclosed in U.S. Patent Application Publication No. 2003/0228715, entitled "Active Matrix Backplane For Controlling Controlled Elements And Method Of Manufacture Thereof", which is incorporated herein by reference.

Deposition vacuum vessels 110 can be utilized for depositing materials on substrate 112 in order to form one or more electronic elements on substrate 112. Each electronic element may be, for example, a thin film transistor (TFT), a memory element or a capacitor. A multilayer circuit can be formed solely by successive depositions of materials on substrate 112 via successive deposition events in deposition vacuum vessels 110.

Each deposition vacuum vessel 110 is connected to a source of vacuum (not shown), that is operative for establishing a suitable vacuum therein in order to enable a charge of the desired material disposed in the corresponding deposition source 118 to be deposited on substrate 112 in a manner known in the art, e.g., sputtering or vapor phase deposition, through apertures in the corresponding shadow mask 122.

In the following description, substrate 112 is described as a continuous flexible sheet which is dispensed from dispensing reel 114, which is disposed in a pre-load vacuum vessel, into the first deposition vacuum vessel 110. However, this is not to be construed as limiting the invention since shadow mask deposition system 100 can be configured to continuously process a plurality of standalone or individual substrates 112. Each deposition vacuum vessel 110 can include supports or guides that avoid the sagging of substrate 112 as it is advanced therethrough.

In operation of shadow mask deposition system 100, the material disposed in each deposition source 118 is deposited on substrate 112 through a corresponding shadow mask 122 in the presence of a suitable vacuum as substrate 112 is advanced through the deposition vacuum vessel 110 by the action of dispensing reel 114 and take-up reel 116, whereupon plural progressive patterns are formed on substrate 112. More specifically, substrate 112 has plural portions, each of which is positioned for a predetermined interval in each deposition vacuum vessel 110. During this predetermined interval, material is deposited from the corresponding deposition source 118 onto the portion of substrate 112 that is positioned in the corresponding deposition vacuum vessel 110. After this predetermined interval, substrate 112 is step advanced so that the portion of substrate 112 is advanced to the next vacuum vessel in series for additional processing, as applicable. This step advancement continues until each portion of substrate 112 has passed through all deposition vacuum vessels 110. Thereafter, each portion of substrate 112 exiting deposition vacuum vessel 110 is received on take-up reel 116, which is positioned in a storage vacuum vessel (not shown). Alternatively, each portion of substrate 112 exiting shadow mask deposition system 100 is separated from the remainder of substrate 112 by a cutter (not shown).

Figure 2:
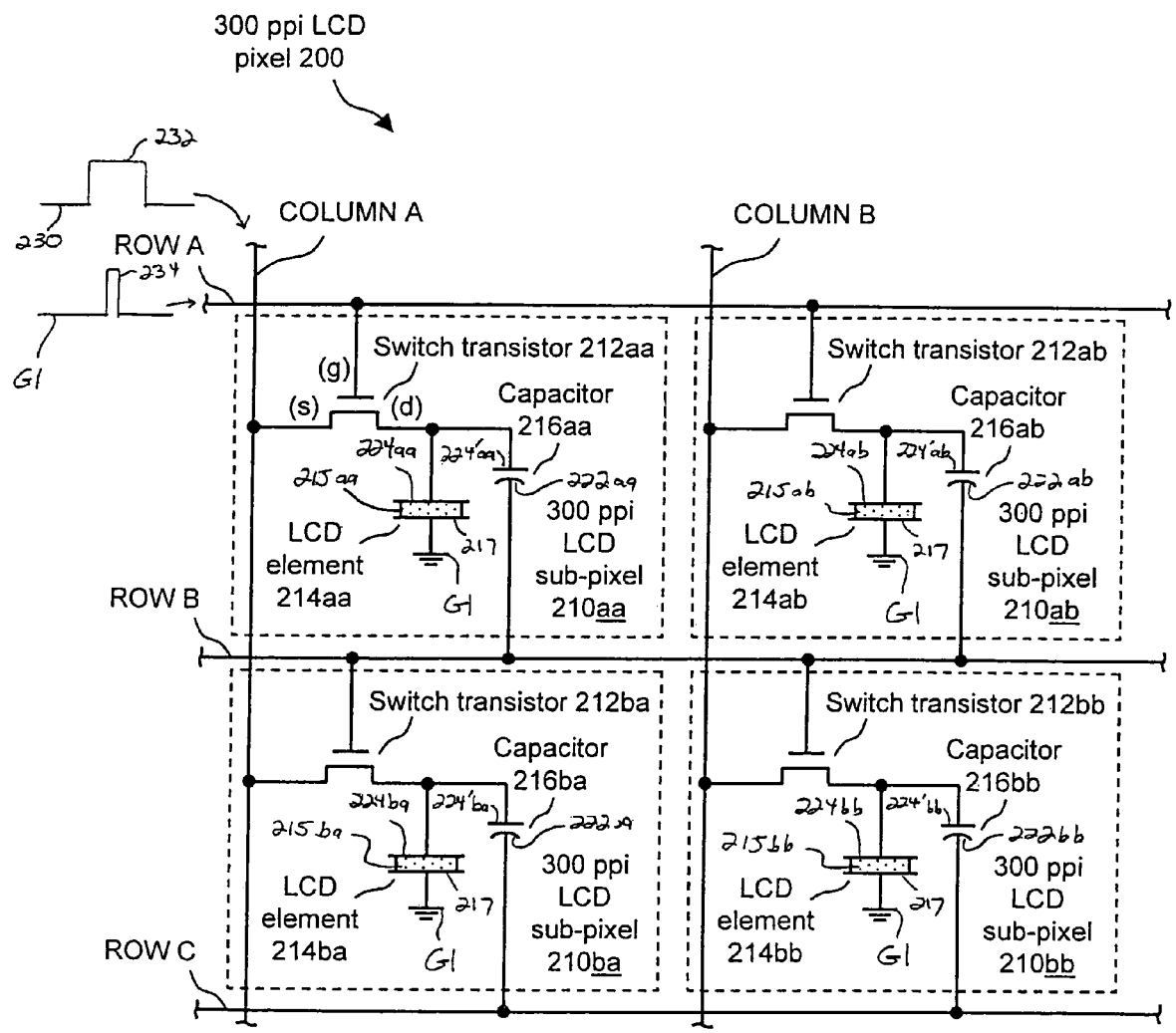
FIG. 2 is a circuit schematic of an exemplary 300 ppi LCD pixel formed of four sub-pixels by use of the shadow mask deposition system of FIG. 1A.

With reference to FIG. 2, an exemplary 300 ppi LCD pixel 200 that can be formed by shadow mask deposition system 100 comprises a 2×2 arrangement of sub-pixels 210, i.e., sub-pixels 210aa, 210ab, 210ba and 210bb. Sub-pixels 210aa, 210ab, 210ba and 210bb can be a RED sub-pixel, a first GREEN sub-pixel, a second GREEN sub-pixel and a BLUE sub-pixel, respectively. Alternatively, sub-pixels 210aa, 210ab, 210ba and 210bb can be a RED sub-pixel, a GREEN sub-pixel, a BLUE sub-pixel and a WHITE sub-pixel, respectively. Since LCD pixel 200 is representative of one of several identical pixels arranged in any user-defined array configuration for forming a complete active matrix LCD device, the description of LCD pixel 200 is not to be construed as limiting the invention.

Sub-pixels 210aa, 210ab, 210ba and 210bb are addressed via pulsed signals applied on a ROW A and a ROW B and via voltage levels applied on a COLUMN A and a COLUMN B. Each sub-pixel 210 comprises a switch transistor 212, such as, without limitation, a standard thin film transistor (TFT); an LCD element 214 formed of liquid crystal material 215 sandwiched between two transparent electrodes and a capacitor 216 which serves as a voltage storage element. In FIG. 2, sub-pixel 210aa includes switch transistor 212aa, LCD element 214aa including liquid crystal material 215aa and capacitor 216aa; sub-pixel 210ab includes switch transistor 212ab, LCD element 214ab including liquid crystal material 215ab and capacitor 216ab; sub-pixel 210ba includes switch transistor 212ba, LCD element 214ba including liquid crystal material 215ba and capacitor 216ba; and sub-pixel 210bb includes switch transistor 212bb, LCD element 214bb including liquid crystal material 215bb and capacitor 216bb.

The arrangement of the electrical components of each sub-pixel 210 will now be described with reference to sub-pixel 210aa. A control or gate terminal (g) of switch transistor 212aa is electrically connected to ROW A, a power or source terminal (s) of switch transistor 212aa is electrically connected to COLUMN A and a power or drain terminal (d) of switch transistor 212aa is electrically connected to a first electrode 224aa of LCD element 214aa and to a first electrode 224'aa of capacitor 216aa. A second electrode 217 of LCD element 214aa is connected to a reference voltage or ground G1. A second electrode 222aa of capacitor 216aa is connected to ROW B. The arrangement of the electrical components of sub-pixels 210aa, 210ab, 210ba and 210bb is identical, except for their connections to their respective ROWs and COLUMNs.

The operation of each sub-pixel 210 of pixel 200 will now be described with reference to sub-pixel 210aa. To activate LCD element 214aa, the voltage applied to COLUMN A is changed from a first voltage 230, e.g., zero volts, to a second voltage 232, e.g., ten volts. During the application of second voltage 232 to COLUMN A, a pulsed signal 234 is applied to ROW A and reference voltage G1 is applied to ROW B. Pulsed signal 234 causes switch transistor 212aa to conduct, whereupon, subject to a voltage drop across transistor 212aa, second voltage 232 impressed on COLUMN A is impressed on first electrode 224aa of LCD element 214aa via drain terminal (d) of switch transistor 212aa thereby activating LCD element 214aa. Because capacitor 216aa is connected between drain terminal (d) of switch transistor 212aa and ROW B, when pulsed signal 234 is applied to ROW A, capacitor 216aa charges to the voltage impressed on COLUMN A, i.e., second voltage 232, minus any voltage drop across switch transistor 212aa.

Upon termination of pulsed signal 234 on ROW A, capacitor 216aa stores the voltage received from COLUMN A. Thereafter, capacitor 216aa impresses its stored voltage on the first electrode 224aa of LCD element 214aa, whereupon LCD element 214aa is held in an active, light emitting state in the absence of pulsed signal 234 on ROW A. Conversely, LCD element 214aa is turned off when pulsed signal 234 is applied on ROW A in the presence of first voltage 230, e.g., zero volts, on COLUMN A. More specifically, applying pulsed signal 234 to ROW A when first voltage 230 is applied to COLUMN A causes switch transistor 212aa to turn on, whereupon capacitor 216aa discharges through switch transistor 212aa thereby deactivating LCD element 214aa. Upon termination of pulsed signal 234, capacitor 216aa is charged to the voltage impressed on COLUMN A, i.e., first voltage 230, plus any voltage drop across switch transistor 212aa, whereupon LCD element 214aa is held in its inactive state even after pulsed signal 234 on ROW A is terminated and switch transistor 212aa is switched off thereby isolating LCD element 214aa and capacitor 216aa from ROW A.

In a like manner, LCD element 214ab can be turned on and off in response to the application of pulsed signal 234 on ROW A when second voltage 232 and first voltage 230, respectively, are applied to COLUMN B and reference voltage G1 is applied to ROW B; LCD element 214ba can be turned on and off in response to the application of pulsed signal 234 on ROW B when second voltage 232 and first voltage 230, respectively, are applied to COLUMN A and reference voltage G1 is applied to ROW C; and LCD element 214bb can be turned on and off in response to the application of pulsed signal 234 on ROW B when second voltage 232 and first voltage 230, respectively, are applied to COLUMN B and reference voltage G1 is applied to ROW C. In practice, each of ROW A, ROW B, ROW C, etc., is held at reference voltage G1 in the absence of pulsed signal 234 being applied thereto. Similarly, each of COLUMN A, COLUMN B, etc., is held at first voltage 230, e.g., zero volts, in the absence of the application of second voltage 232, e.g., ten volts, thereto.

Figure 3:
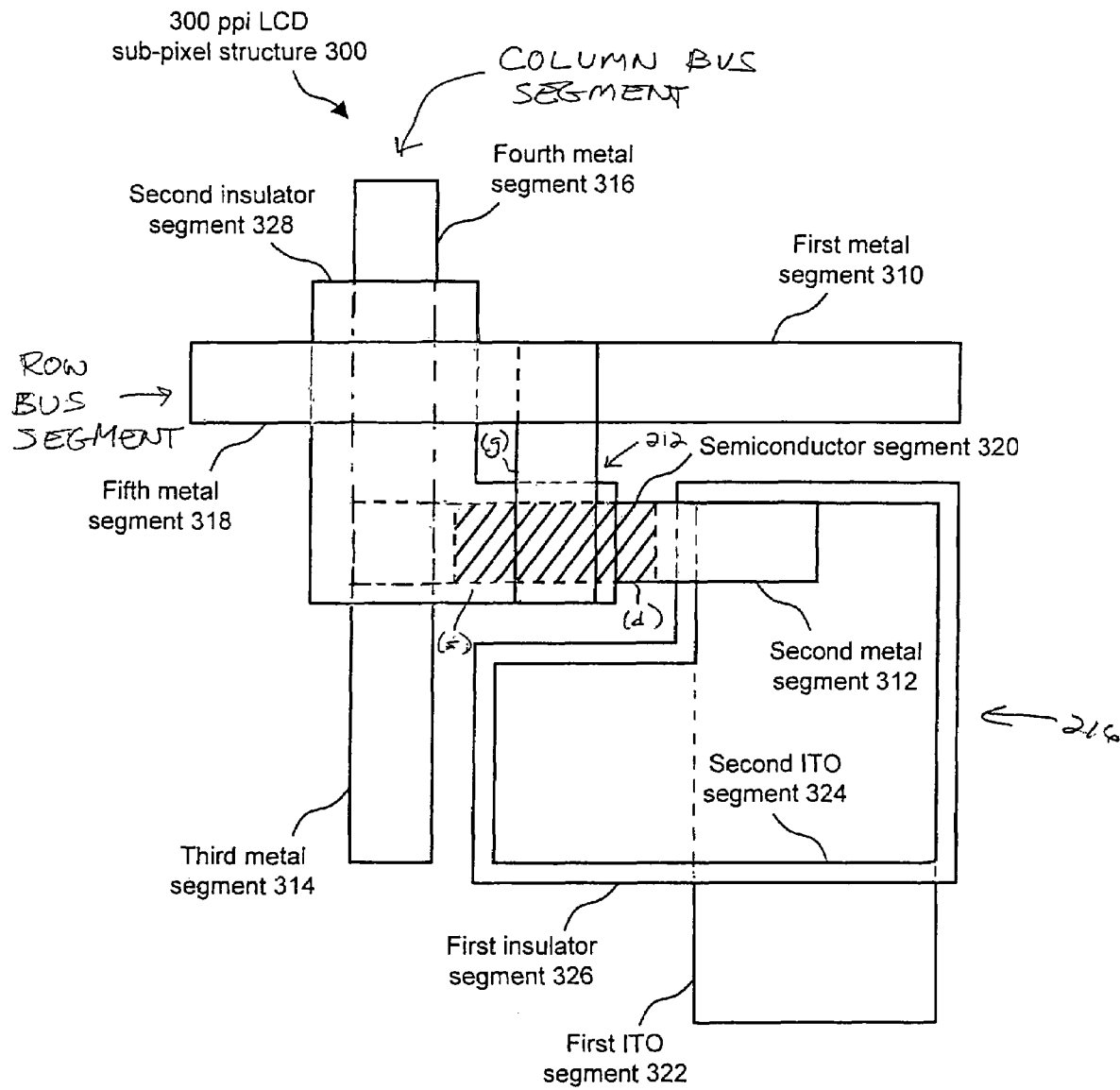
FIG. 3 is a plan view of an exemplary physical layout of one of the sub-pixels of FIG. 2.

With reference to FIG. 3 and with continuing reference to FIG. 2, a sub-pixel structure 300 representative of the physical structure that forms each sub-pixel 210 of pixel 200 includes an elongated first metal segment 310, an elongated second metal segment 312, an elongated third metal segment 314, an L-shaped fourth metal segment 316, an L-shaped fifth metal segment 318, an elongated semiconductor segment 320, an elongated first indium-tin oxide (ITO) segment 322, an L-shaped second ITO segment 324, an L-shaped first insulator segment 326 and an L-shaped second insulator segment 328.

Metal segments 310, 312, 314, 316 and 318 are formed of any electrically conductive material that is depositable via a shadow mask deposition process, such as, without limitation, molybdenum (Mo), copper (Cu), nickel (Ni), chromium (Cr) or aluminum (Al). Semiconductor segment 320 is formed of a semiconductor material that is depositable via a shadow mask deposition process and which is suitable for forming a thin-film-transistor (TFT) by vacuum evaporation, such as, without limitation, cadmium selenide (CdSe), cadmium sulfide (CdS) or tellurium (Te). ITO segments 322 and 324 are formed of indium-tin-oxide (ITO), which is a transparent, electrically conductive material depositable via a shadow mask deposition process. Insulator segments 326 and 328 are formed of any transparent, electrically non-conductive material that is depositable via a shadow mask deposition process, such as, without limitation, aluminum oxide ($Al_2O_3$) or silicon dioxide ($SiO_2$).

Semiconductor segment 320 is the current-carrying layer of switch transistor 212. The combination of fifth metal segment 318 overlapping first metal segment 310 in the manner shown in FIG. 3 forms a ROW bus segment and forms the gate terminal (g) of switch transistor 212. The combination of fourth metal segment 316 overlapping third metal segment 314 in the manner shown in FIG. 3 forms a COLUMN bus segment and forms the source terminal (s) of switch transistor 212. Second metal segment 312 forms the drain terminal (d) of switch transistor 212 and forms a contact with second ITO segment 324 which functions as both the first electrode 224 of LCD element 214 and the first electrode 224' of capacitor 216. First ITO segment 322 functions as second electrode 222 of capacitor 216 which is connected to the next successive ROW bus. First insulator segment 326 electrically isolates first ITO segment 322 from second ITO segment 324 thereby functioning as the dielectric of capacitor 216. Second insulator segment 328 electrically isolates the combination of first metal segment 310 and fifth metal segment 318 from the combination of third metal segment 314 and fourth metal segment 316 thereby electrically isolating the ROW bus segment from the COLUMN bus segment. Second insulator segment 328 also serves as the gate dielectric of switch transistor 212.

Desirably, each segment 310-328 of each sub-pixel structure 300 is formed on a transparent substrate (not shown), such as, without limitation, a glass substrate or a color filter of the type typically used to form red, green and blue pixel regions in a liquid crystal display. Each segment of each sub-pixel structure 300 is formed by a shadow mask deposition process in a shadow mask deposition system, like shadow mask deposition system 100.

An LCD is a display device that includes an electrically-controlled, light-polarizing liquid, such as liquid crystal material 215, that is trapped in cells between two transparent polarizing sheets positioned in spaced parallel relation. Each cell includes at least one electrical contact on each polarizing sheet for facilitating the application of an electric potential to the light-polarizing liquid inside. The formation of a functioning LCD pixel 200 can be completed by the placement of liquid crystal material 215 atop each sub-pixel structure 300 of LCD pixel 200 and, subsequently, the placement of one continuous film of ITO atop liquid crystal material 215, whereupon the liquid crystal material is sandwiched between the continuous film of ITO (which may serve as a ground plane) and each sub-pixel structure 300. The continuous film of ITO functions as the opposite electrode of each LCD element 214 with respect to the corresponding second ITO segment 324. The continuous film of ITO is represented in LCD pixel 200 of FIG. 2 by the reference number 217 associated with the second electrode 217 of each LCD element 214. When a suitable electrical potential is applied between a second ITO segment 324 and the continuous film of ITO, liquid crystal 215 material therebetween is activated.

Figure 4:
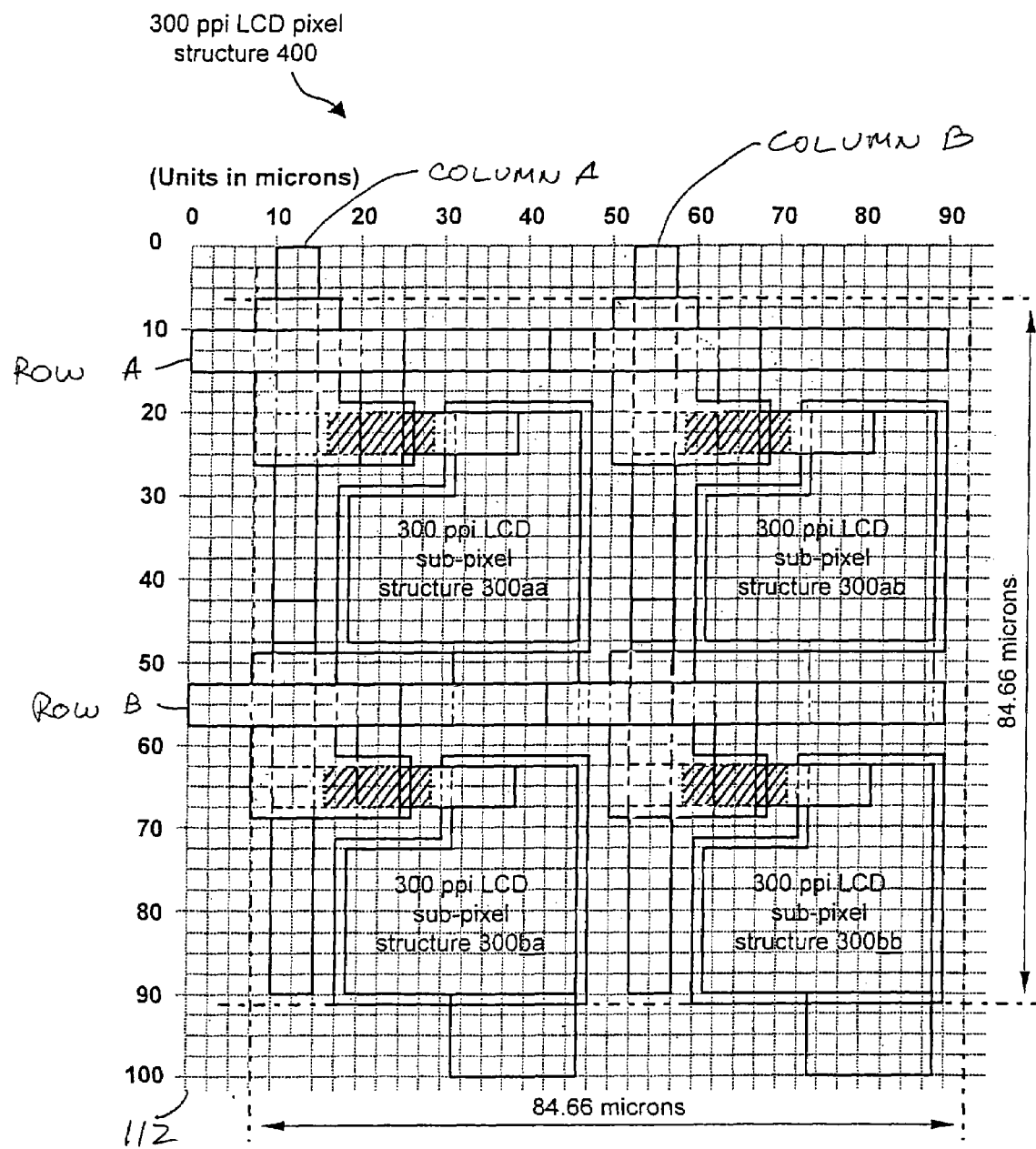
FIG. 4 is a plan view of an exemplary physical layout of the sub-pixels that form the LCD pixel of FIG. 2.

With reference to FIG. 4 and with continuing reference to FIGS. 1-3, a physical implementation of a 300 ppi LCD pixel structure 400 corresponding to the circuit schematic of 300 ppi LCD pixel structure 200 shown in FIG. 2, includes a 2×2 array of sub-pixel structures 300, i.e., sub-pixel structures 300aa, 300ab, 300ba and 300bb.

Pixel structure 400 is shown upon substrate 112. In FIG. 4, substrate 112 includes a grid which is shown only to indicate the general geometry, dimensions and relative placement of the individual segments of the 2×2 array of sub-pixel structures 300. Accordingly, the grid on substrate 112 in FIG. 4 is not to be construed as limiting the invention.

In one exemplary embodiment, the overall dimension of pixel structure 400 is 84.66×84.66 microns and the overall dimension of each sub-pixel structure 300 is 42.33×42.33 microns. The geometry, dimensions and relative placement of the individual segments of each sub-pixel structure 300 is not limited to that shown in FIG. 4 and, subsequently, shown in FIGS. 5A-5I so long as the spacing from one pixel structure 400 to the next in both the X and Y directions does not exceed 84.66 microns. The foregoing dimensions of pixel structure 400 and sub-pixel structures 300, however, are exemplary only and are not to be construed as limiting the invention.

An exemplary, non-limiting sequence of depositions to form LCD pixel structure 400 will now be described with reference to FIGS. 5A-5I.

Figure 5A:
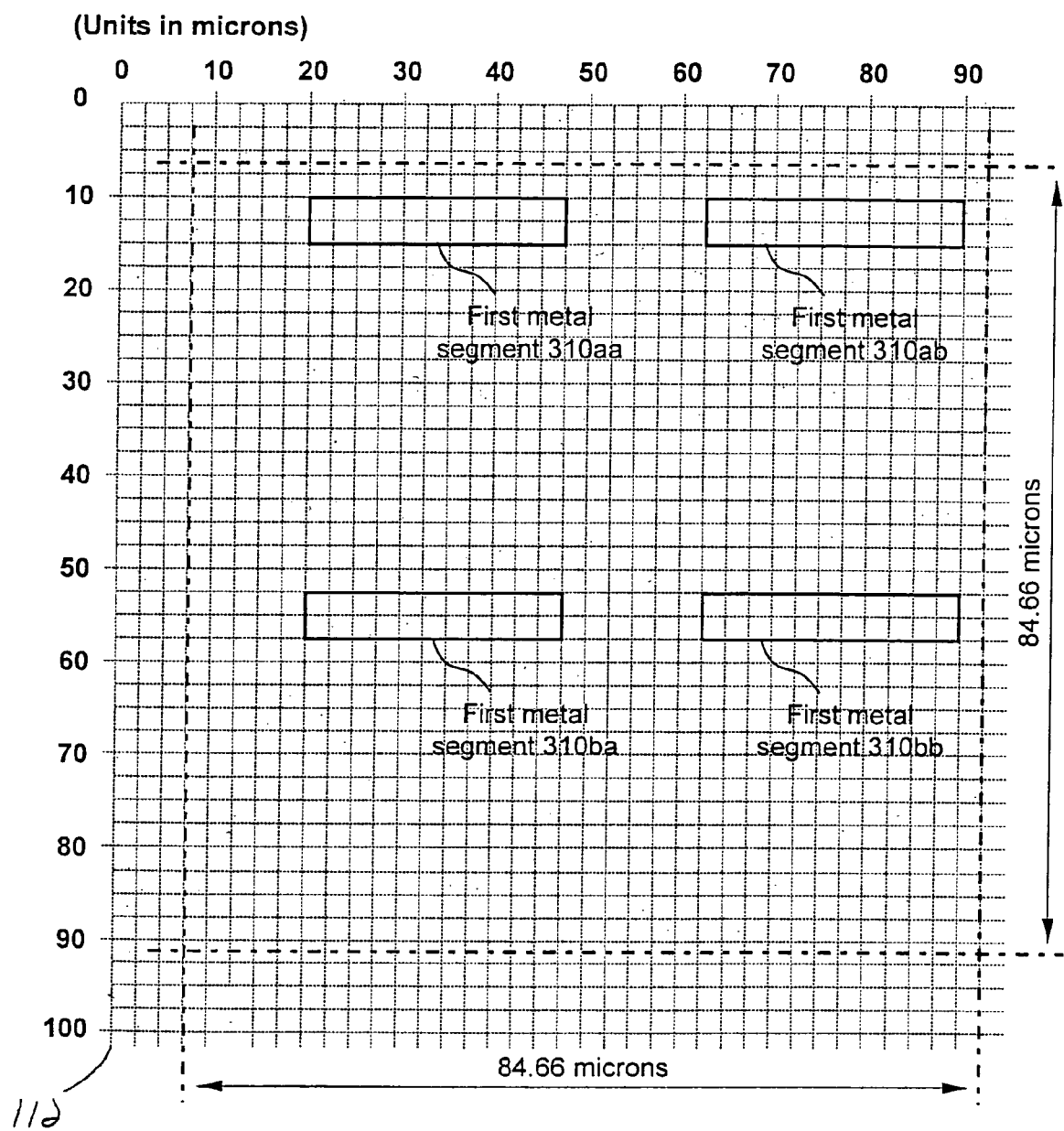
FIGS. 5A through 5I are plan views of exemplary successive depositions of the various segments that form the sub-pixels of FIG. 4.

With reference to FIG. 5A and with continuing reference to all previous Figs., first metal segments 310aa, 310ab, 310ba and 310bb are initially deposited on substrate 112 in shadow mask deposition system 100 by way of a shadow mask having a pattern of apertures of the same geometry, dimensions and spacing as said first metal segments.

Figure 5B:
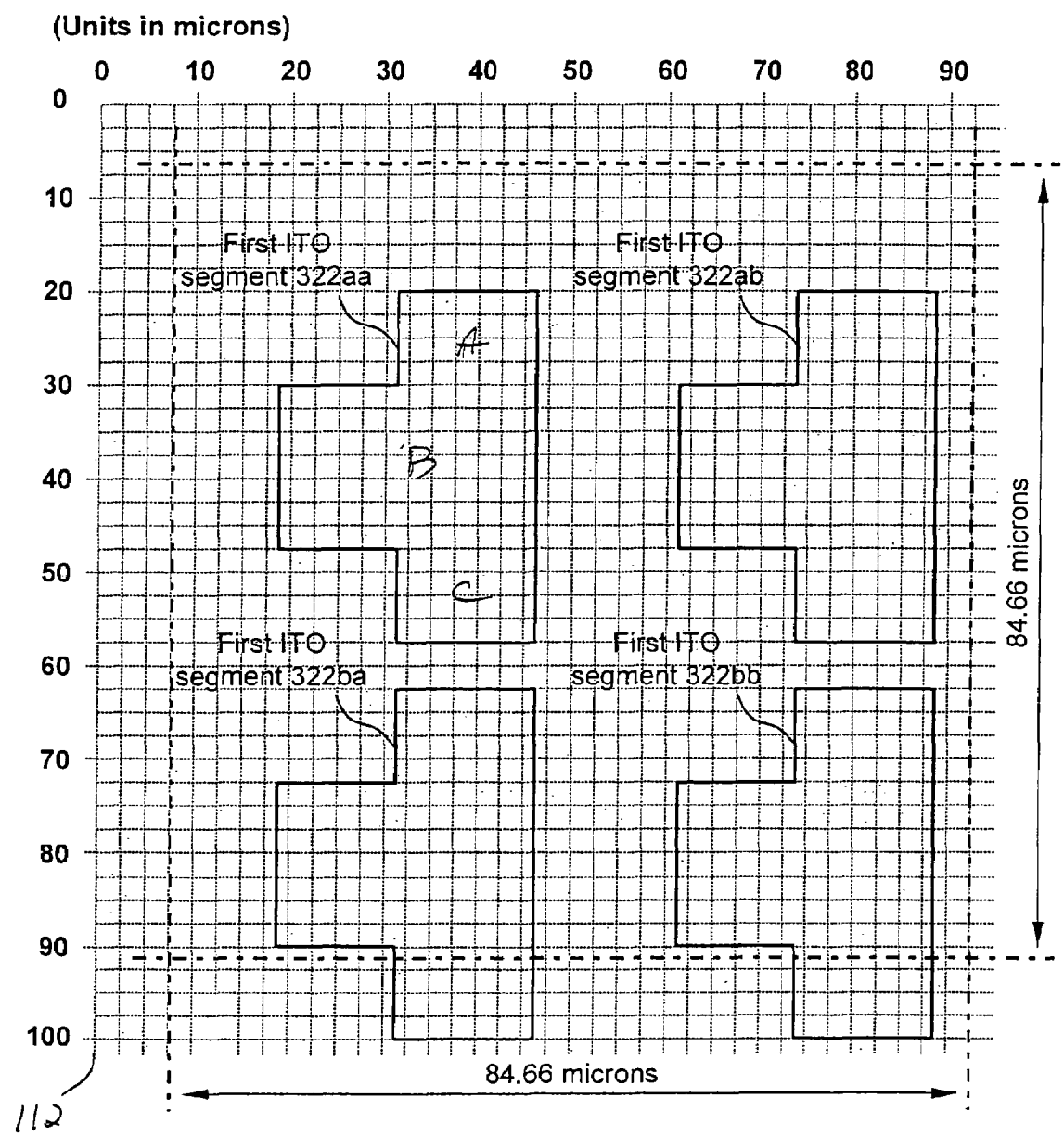

With reference to FIG. 5B and with continuing reference to all previous Figs., next first ITO segments 322aa, 322ab, 322ba and 322bb are deposited on substrate 112 in shadow mask deposition system 100 by way of a shadow mask having a pattern of apertures of the same geometry, dimensions and spacing as said first ITO segments.

Figure 5C:
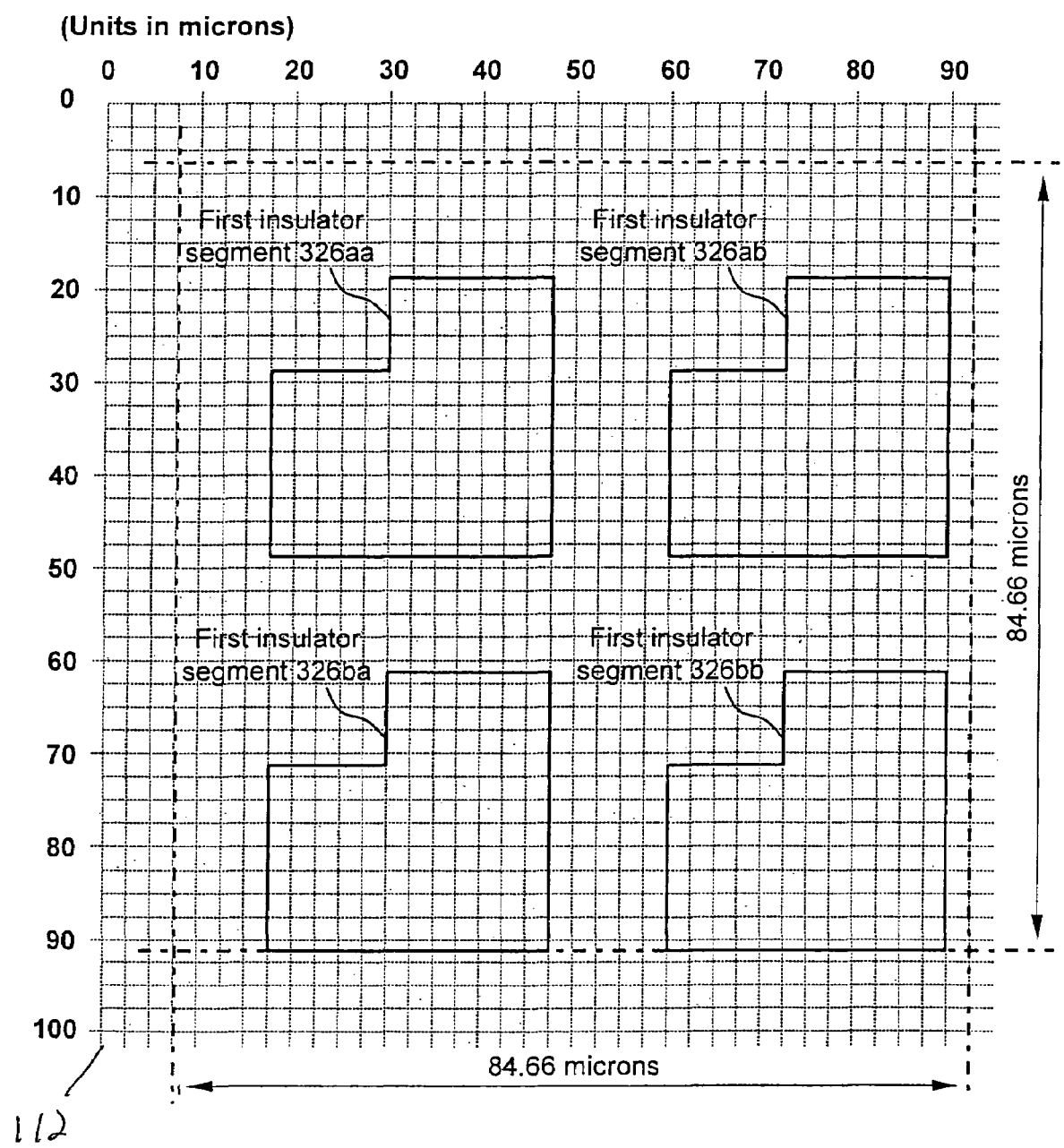

With reference FIG. 5C and with continuing reference to all previous Figs., next first insulator segments 326aa, 326ab, 326ba and 326bb are deposited on substrate 112 in shadow mask deposition system 100 by way of a shadow mask having a pattern of apertures of the same geometry, dimensions and spacing as said first insulator segments.

Comparing FIGS. 5B and 5C, it can be seen that first insulator segments 326aa, 326ab, 326ba and 326bb are deposited atop first ITO segments 322aa, 322ab, 322ba and 322bb. More specifically, each first insulator segment 326 completely covers portions A and B of the corresponding first ITO segment 322. However, segment C of each first ITO segment 322 is not covered by the corresponding first insulator segment 326.

Figure 5D:
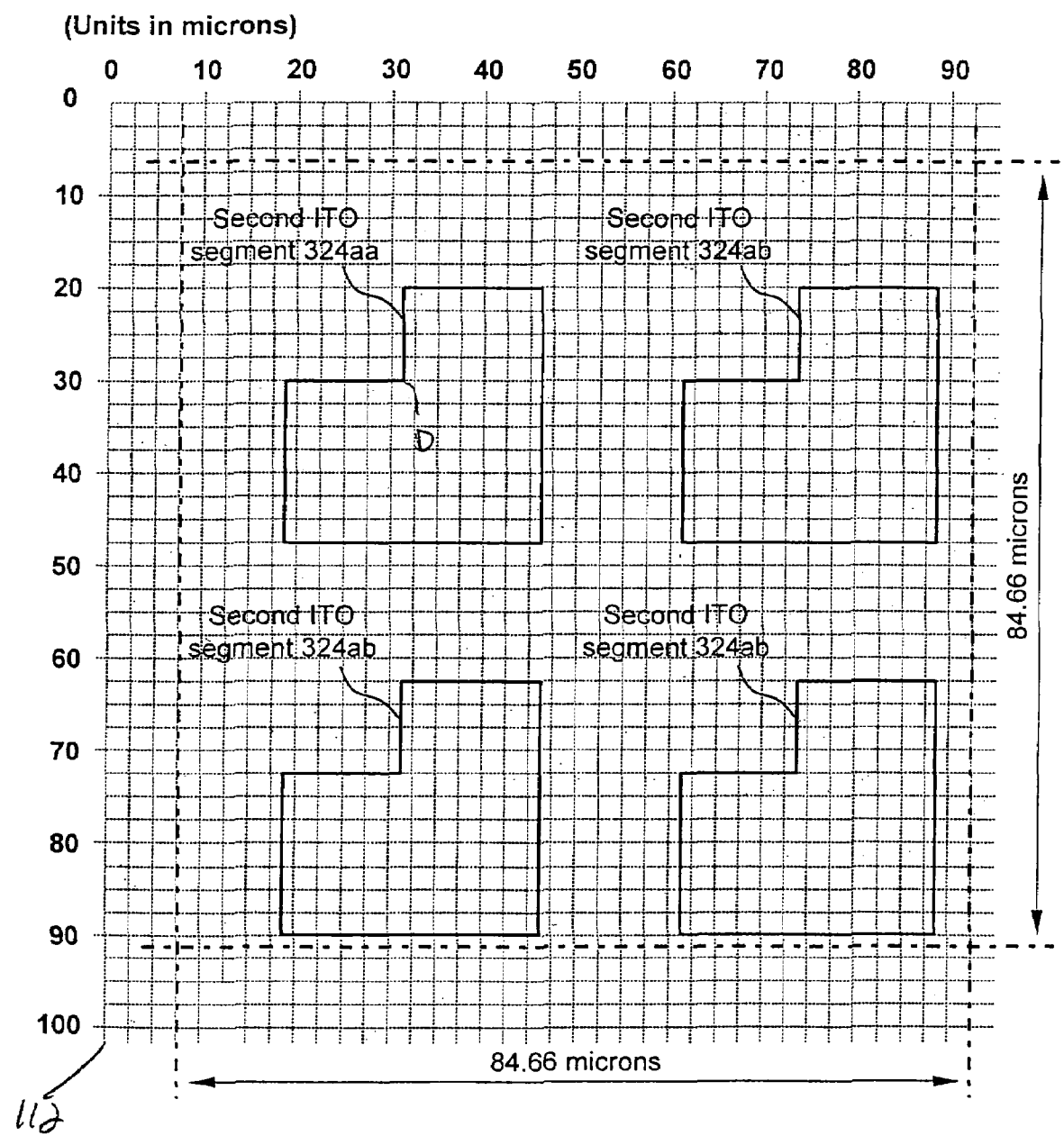

With reference to FIG. 5D and with continuing reference to all previous Figs., next, second ITO segments 324aa, 324ab, 324ba and 324bb are deposited on substrate 112 in shadow mask deposition system 100 by way of a shadow mask having a pattern of apertures of the same geometry, dimensions and spacing as said second ITO segments.

Comparing FIGS. 5C and 5D, it can be seen that each second ITO segment 324 is deposited atop of the corresponding first insulator segment 326 such that a portion of each first insulator segment 326 extends from beneath and around the periphery of the corresponding second ITO segment 324.

Figure 5E:
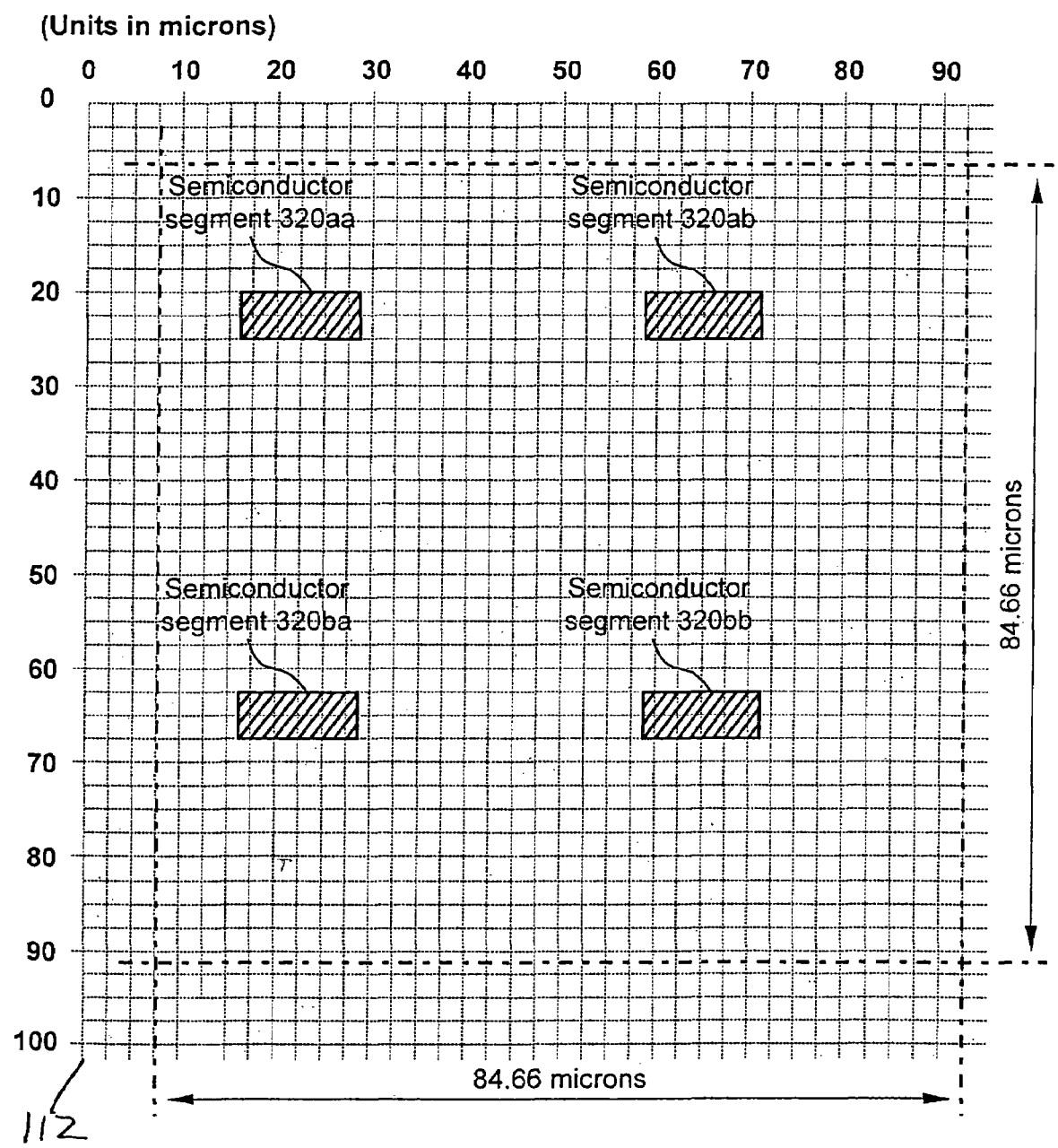

With reference to FIG. 5E and with continuing reference to all previous Figs., next, semiconductor segments 320aa, 320ab, 320ba and 320bb are deposited on substrate 112 in shadow mask deposition system 100 by way of a shadow mask having a pattern of apertures of the same geometry, dimensions and spacing as said semiconductor segments. More specifically, each semiconductor segment 320 is deposited between a previously deposited first metal segment 310 and a corner D of a corresponding second ITO segment 324.

Figure 5F:
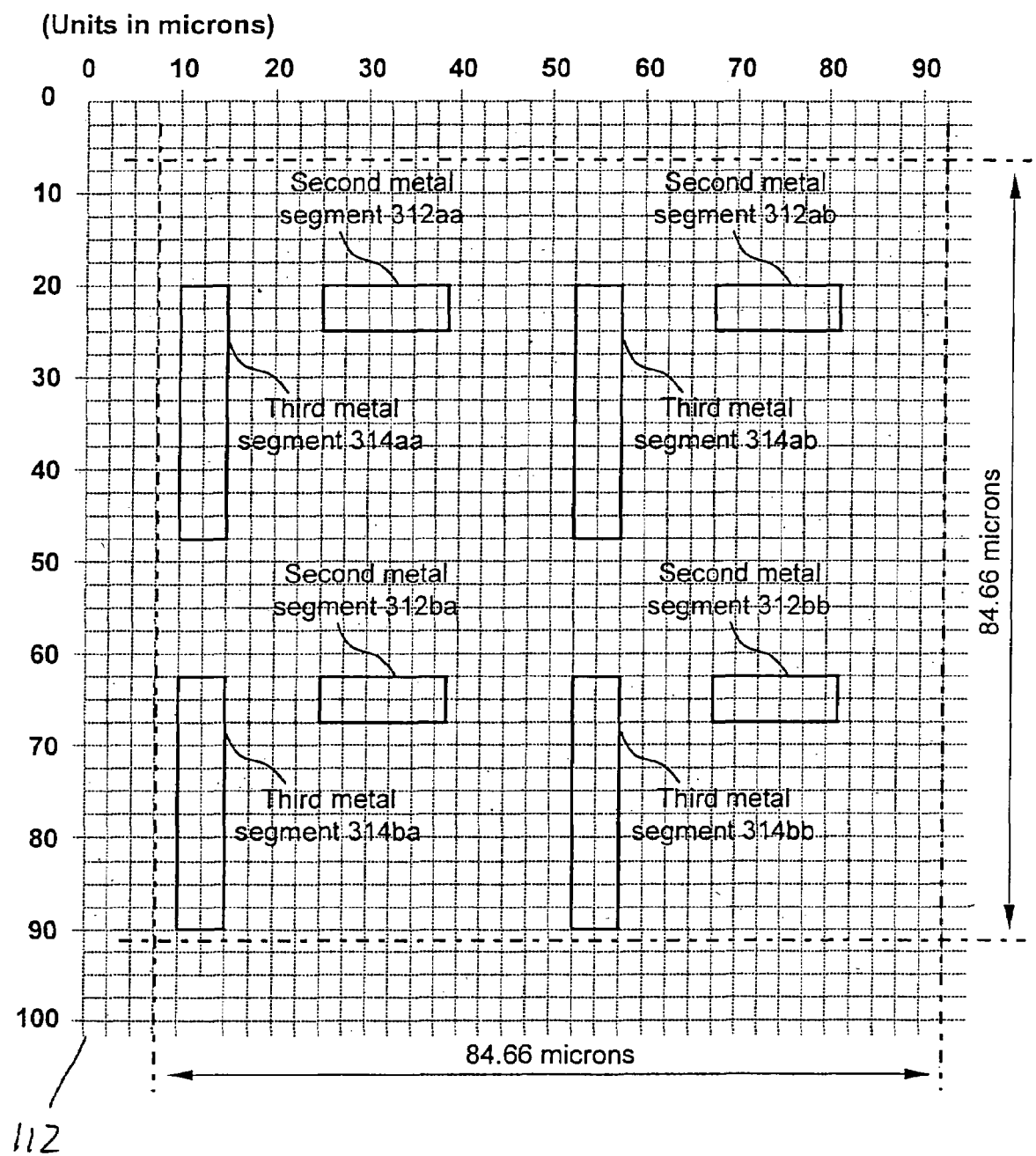

With reference to FIG. 5F and with continuing reference to all previous Figs., next, second metal segments 312aa, 312ab, 312ba and 312bb along with third metal segments 314aa, 314ab, 314ba and 314bb are deposited on substrate 112 in shadow mask deposition system 100 by way of a shadow mask having a pattern of apertures of the same geometry, dimensions and spacing as said second and third metal segments. Each second metal segment 312 is deposited overlapping the corresponding semiconductor segment 320 and the corresponding second ITO segment 324. Each third metal segment 314 is deposited adjacent a corresponding semiconductor segment 320 and second ITO segment 324.

Figure 5G:
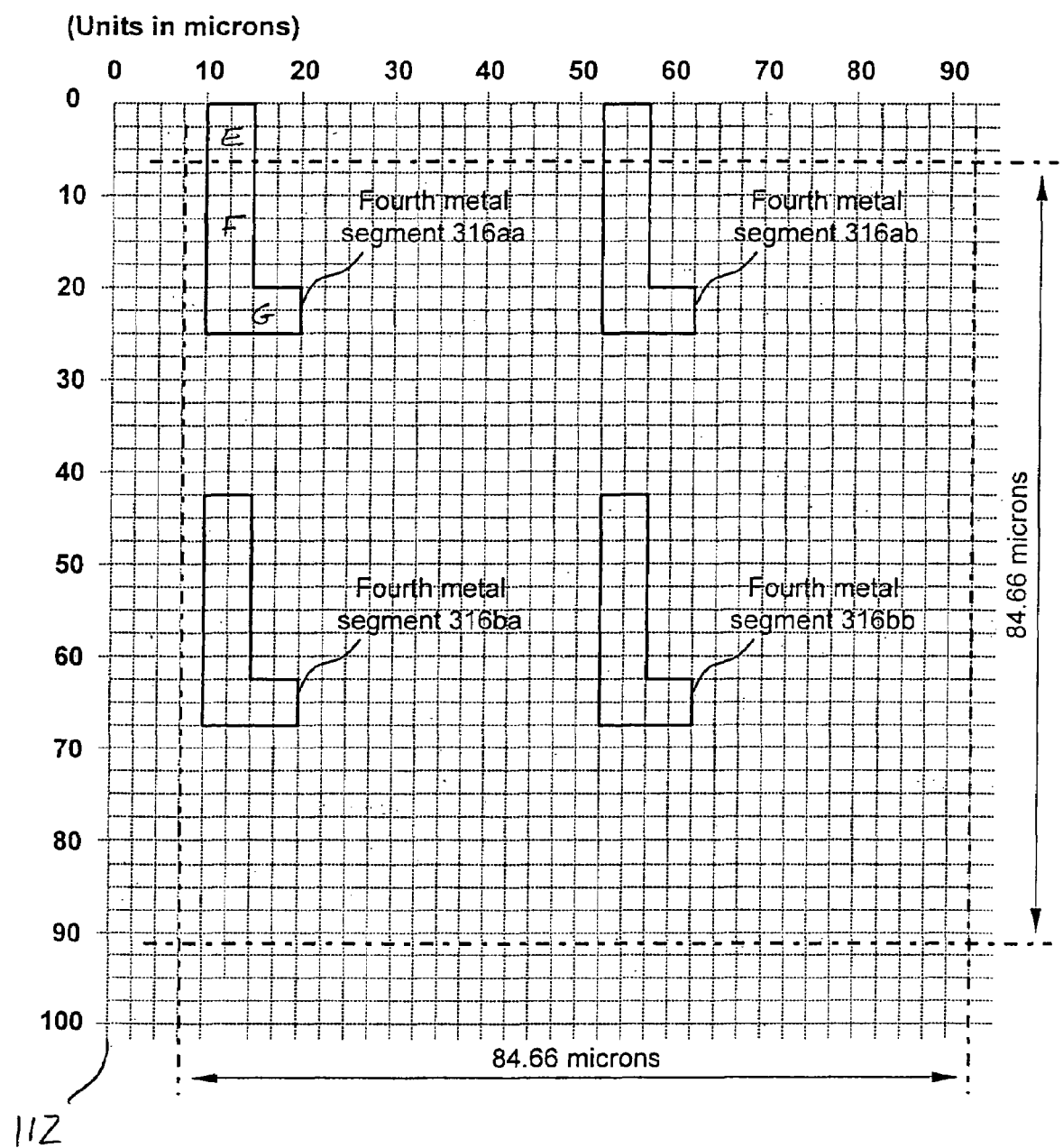

With reference to FIG. 5G and with continuing reference to all previous Figs., next, fourth metal segments 316aa, 316ab, 316ba and 316bb are deposited on substrate 112 in shadow mask deposition system 100 by way of a shadow mask having a pattern of apertures of the same geometry, dimensions and spacing as said fourth metal segments. Each fourth metal segment 316 is deposited overlapping a corresponding third metal segment 314 and a corresponding semiconductor segment 320.

Figure 5H:
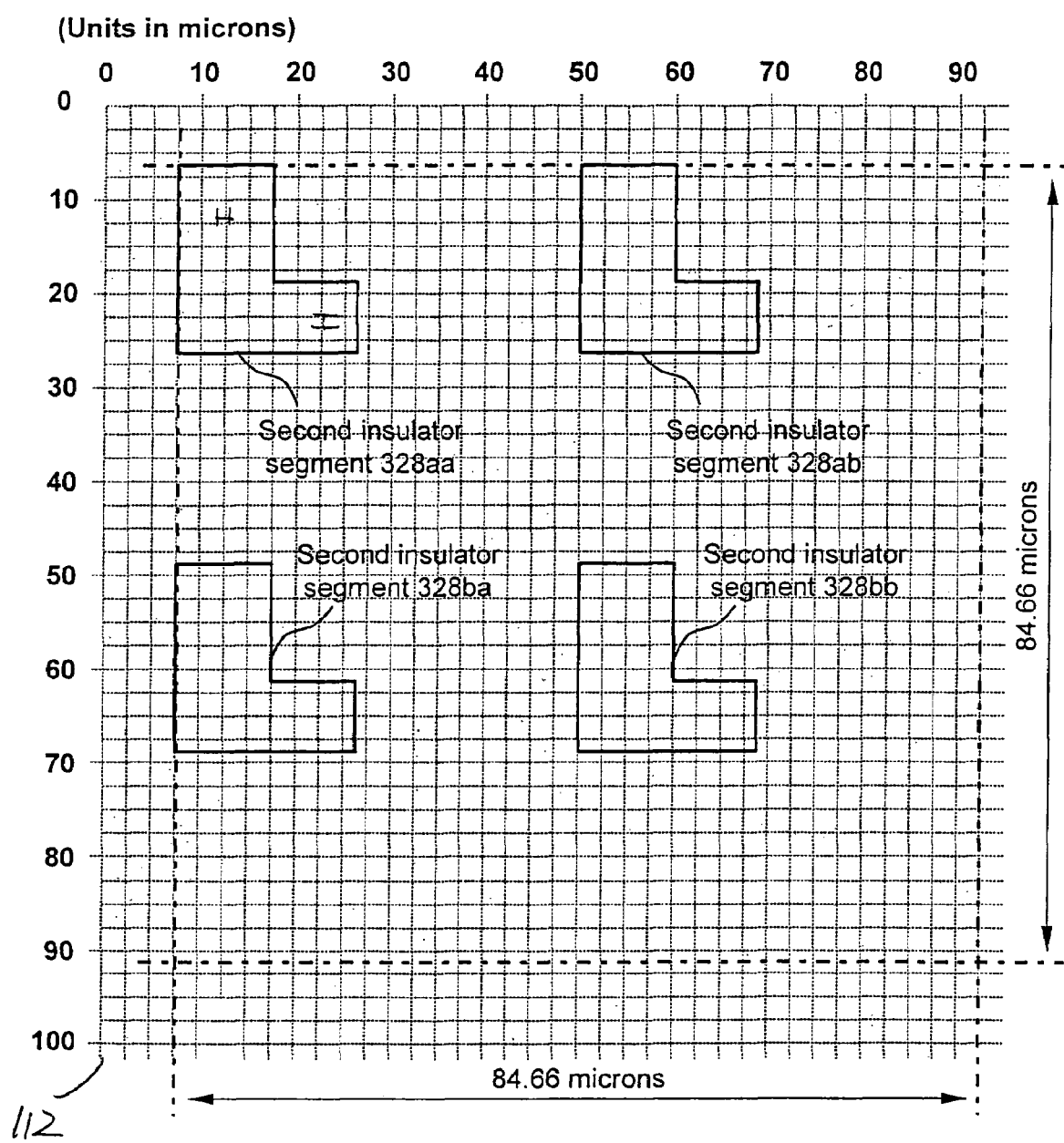

With reference to FIG. 5H and with continuing reference to all previous Figs., next, second insulator segments 328aa, 328ab, 328ba and 328bb are deposited on substrate 112 in shadow mask deposition system 100 by way of a shadow mask having a pattern of apertures of the same geometry, dimensions and spacing as said second insulator segments. Each second insulator segment 328 is deposited such that portion E of the corresponding fourth metal segment 316 is not covered thereby, while portions F and G of the corresponding fourth metal segment 316, along with a majority of the corresponding semiconductor segment 320 opposite second metal segment 312, are covered.

Figure 5I:
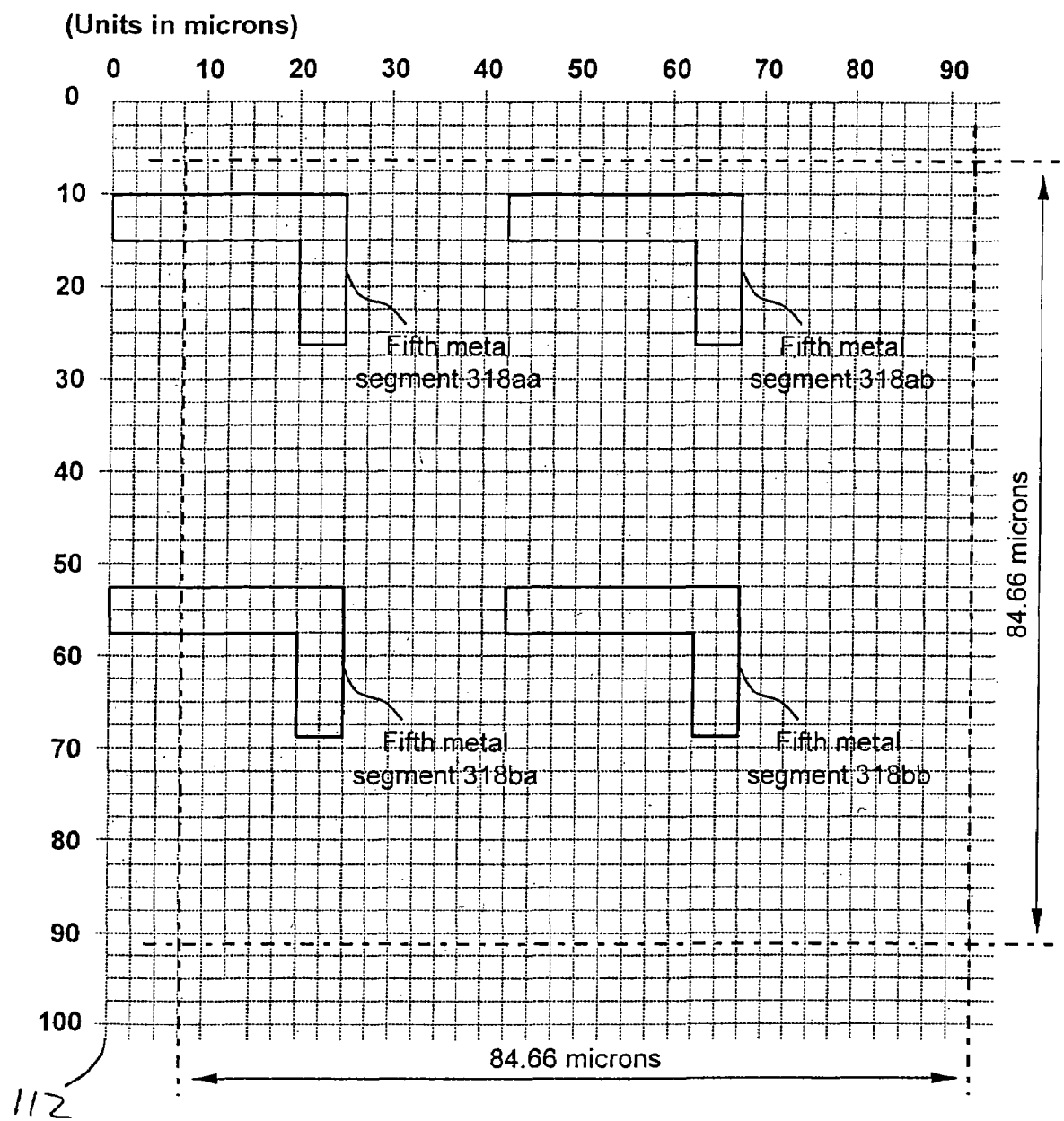

Lastly, with reference to FIG. 5I and with reference to all previous Figs., fifth metal segments 318aa, 318ab, 318ba and 318bb are deposited on substrate 112 in shadow mask deposition system 100 by way of a shadow mask having a pattern of apertures of the same geometry, dimensions and spacing as said fifth metal segments. Each fifth metal segment 318 is deposited overlapping an end of a corresponding first metal segment 310 adjacent corresponding semiconductor segment 320, and overlapping, but not completely covering, portions H and I of the corresponding second insulator segment 328.

Figure 6:
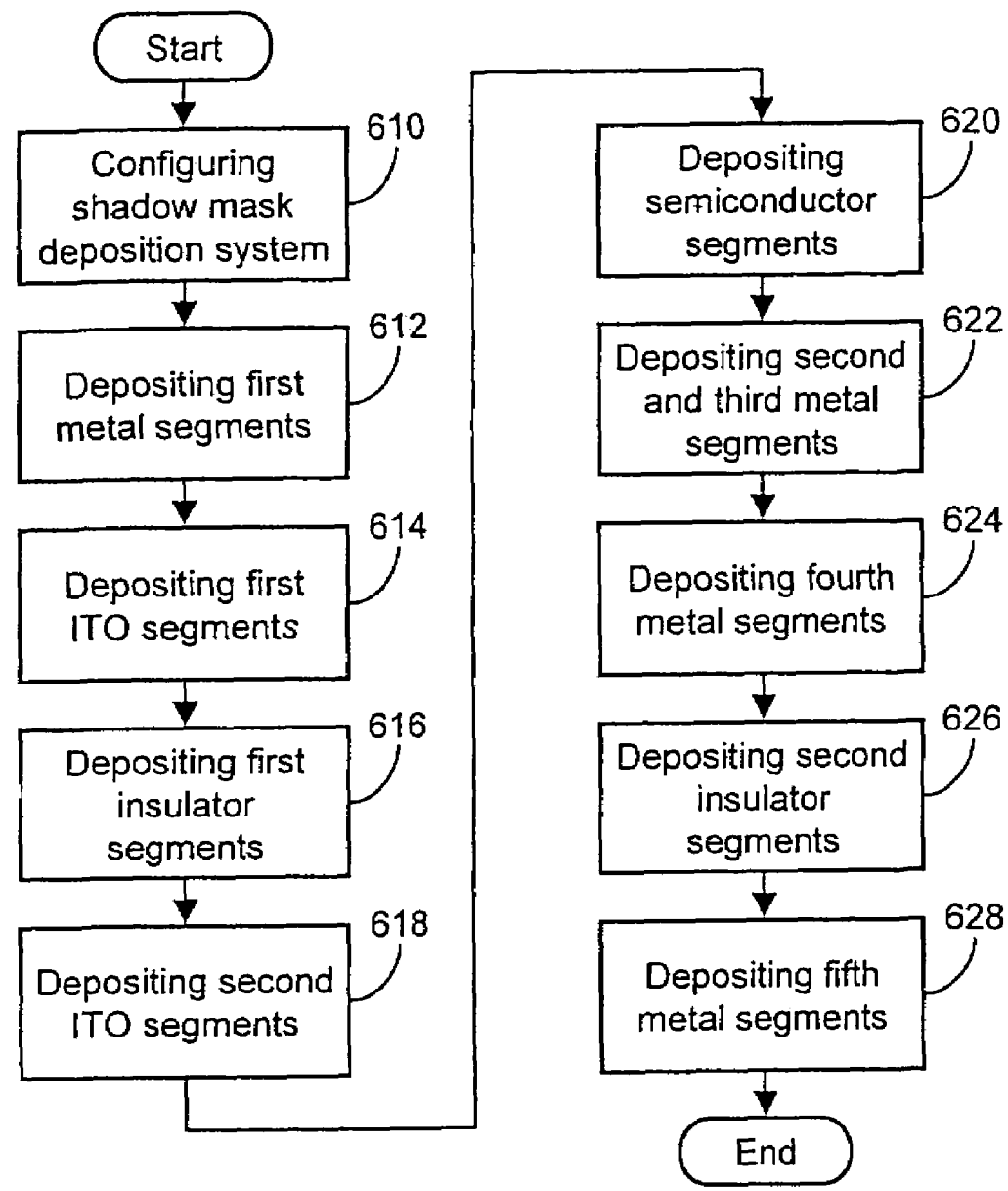
FIG. 6 is a flow diagram of a method of forming the sub-pixels of FIG. 4.

With reference to FIG. 6 and with continuing reference to all previous Figs., a method 600 of forming LCD pixel structure 400 includes step 610, wherein shadow mask deposition system 100 is configured to include nine serially arranged vacuum deposition chambers 110 with a substrate 112 translating therethrough. Each vacuum deposition chamber 110 includes a unique shadow mask 122 and a unique deposition source 118. Shadow mask deposition system 100, however, is not to be construed as limiting the invention since a shadow mask deposition system including one or more vacuum deposition chambers, each of which includes one or more shadow masks and one or more deposition sources, can be utilized. The former is assumed in the remaining steps of method 600.

The method then advances to step 612, wherein substrate 112 is translated into a first vacuum deposition chamber, such as deposition vacuum vessel 110a, wherein a plurality of first metal segments 310 is deposited thereon by way of a shadow mask, such as a shadow mask 122a, which has for each first metal segment 310 an aperture for passing evaporant material from the corresponding deposition source, such as a deposition source 118a, to form the first metal segment 310 on substrate 112.

The method then advances to step 614, wherein substrate 112 is translated into a second vacuum deposition chamber, such as deposition vacuum vessel 110b, wherein a plurality of first ITO segments 322 is deposited thereon by way of a shadow mask, such as a shadow mask 122b, which has for each first ITO segment 322 an aperture for passing evaporant material from the corresponding deposition source, such as a deposition source 118b, to form the first ITO segment 322 on substrate 112.

The method then advances to step 616, wherein substrate 112 is translated into a third vacuum deposition chamber, such as deposition vacuum vessel 110c, wherein a plurality of first insulator segments 326 is deposited thereon by way of a shadow mask, such as a shadow mask 122c, which has for each first insulator segment 326 an aperture for passing evaporant material from the corresponding deposition source, such as a deposition source 118c, to form the first insulator segment 326 on substrate 112.

The method then advances to step 618, wherein substrate 112 is translated into a fourth vacuum deposition chamber, such as deposition vacuum vessel 110d, wherein a plurality of second ITO segments 324 is deposited thereon by way of a shadow mask, such as a shadow mask 122d, which has for each second ITO segment 324 an aperture for passing evaporant material from the corresponding deposition source, such as a deposition source 118d, to form the second ITO segment 324 on substrate 112.

The method then advances to step 620, wherein substrate 112 is translated into a fifth deposition chamber, such as deposition vacuum vessel 110e, wherein a plurality of semiconductor segments 320 is deposited thereon by way of a shadow mask, such as a shadow mask 122e, which has for each semiconductor segment 320 an aperture for passing evaporant material from the corresponding deposition source, such as a deposition source 118e, to form the semiconductor segment 320 on substrate 112.

The method then advances to step 622 wherein substrate 112 is translated into a sixth vacuum deposition chamber, such as deposition vacuum vessel 110f, wherein a plurality of second metal segments 312 and a plurality of third metal segments 314 are concurrently deposited thereon by way of a shadow mask, such as a shadow mask 122f, which has for each second metal segment a corresponding aperture and which has for each third metal segment a corresponding aperture for passing evaporant material from the corresponding deposition source, such as a deposition source 118f, to form the second metal segment and the third metal segment 314 on substrate 112.

The method then advances to step 624, wherein substrate 112 is translated into a seventh vacuum deposition chamber, such as a deposition vacuum vessel 110g, wherein a plurality of fourth metal segments 316 is deposited thereon by way of a shadow mask, such as shadow mask 122g, which has for each fourth metal segment 316 an aperture for passing evaporant material from the corresponding deposition source, such as a deposition source 118g, to form the fourth metal segment 316 on substrate 112.

The method then advances to step 626, wherein substrate 112 is translated into an eighth vacuum deposition chamber, such as a deposition vacuum vessel 110h, wherein a plurality of second insulator segments 328 is deposited thereon by way of a shadow mask, such as a shadow mask 122h, which has for each second insulator segment 328 an aperture for passing evaporant material from a deposition source, such as a deposition source 118h, to form the second insulator segment 328 on substrate 112.

Lastly, the method advances to step 628, wherein substrate 112 is translated into a ninth vacuum chamber, such as a deposition vacuum vessel 110i, wherein a plurality of fifth metal segments is deposited thereon by way of a shadow mask, such as a shadow mask 122i, which has for each fifth metal segment 318 an aperture for passing evaporant material from the corresponding deposition source, such as a deposition source 118i, to form the fifth metal segment 318 on substrate 112.

In the foregoing description, only second metal segments 312 and third metal segment 314 were described as being deposited simultaneously in the same deposition vacuum vessel 110. However, this is not to be construed as limiting the invention since second metal segments 312 and third metal segments 314 can be deposited in separate deposition vacuum vessels 110. Moreover, any logical combination of metal segments 310, 312, 314, 316 and/or 318 can be deposited in a single deposition event by way of a single shadow mask, provided such shadow mask has sufficient structural rigidity to define the necessary aperture(s) to facilitate such deposition. For example, first ITO segments 322, first insulator segments 326 and second ITO segments 324 can be deposited in the manner and sequence described above. Semiconductor segments 320 can be deposited on or before the deposition of first ITO segments 322, first insulator segments 326 and second ITO segments 324. Next, a first metal deposition event can deposit metal corresponding to the metal segments 310, 312, 314 and/or 316 by way of a suitable shadow mask having a corresponding pattern of apertures. Thereafter, second insulator segments 328 and fifth metal segments 318 can be deposited in the manner described above. Thus, as few as two metal deposition events can be utilized to form LCD pixel structure 400 provided the mask for each metal deposition event has sufficient structural integrity to facilitate quality metal deposition. Accordingly, the number of deposition steps, the pattern of material deposited in each deposition step and the order of the deposition steps described above are not to be construed as limiting the invention.

Figure 7:
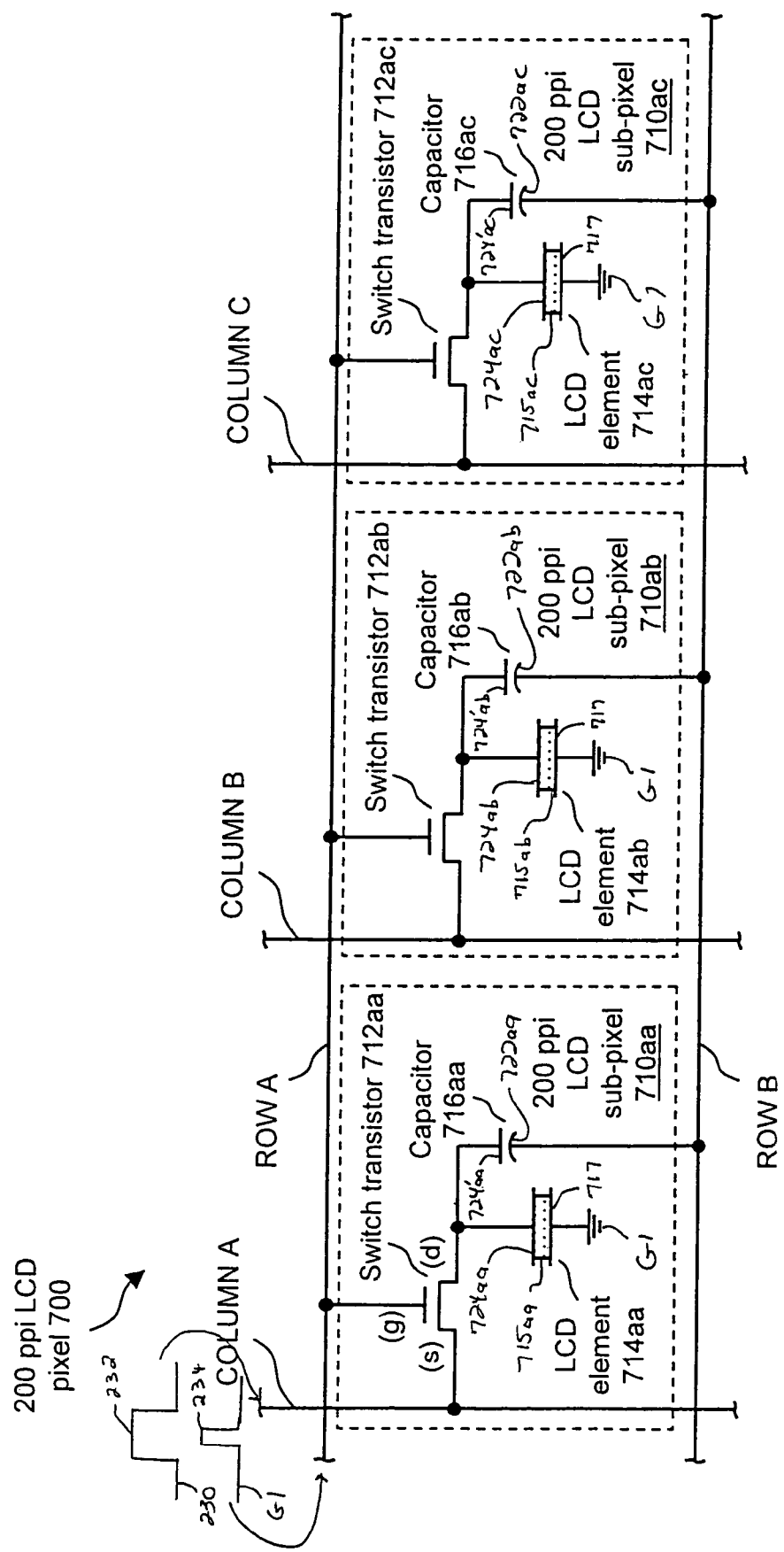
FIG. 7 is a circuit schematic of an exemplary 200 ppi LCD pixel formed of three sub-pixels by use of the shadow mask deposition system of FIG. 1A.

With reference to FIG. 7 and with continuing reference to all previous Figs., an exemplary 200 ppi LCD pixel 700 formed by shadow mask deposition system 100 comprises a 3×1 arrangement of sub-pixels 710, i.e., sub-pixels 710aa, 710ab and 710ac. Sub-pixels 710aa, 710ab and 710ac can be representative of, for example, RED, GREEN and BLUE sub-pixels, respectively.

Sub-pixels 710aa, 710ab and 710ac are addressed via a pulsed signal, like pulsed signal 234, applied on a ROW A and via voltage levels, like voltage levels 230 and 232, applied on a COLUMN A, a COLUMN B and a COLUMN C. Each sub-pixel 710 comprises a switch transistor 712, such as, without limitation, a standard TFT; an LCD element 714 formed of liquid crystal material, like liquid crystal material 215, sandwiched between two transparent electrodes and a capacitor 716 which serves as a voltage storage element. In FIG. 7, sub-pixel 710aa includes switch transistor 712aa, LCD element 714aa and capacitor 716aa; sub-pixel 710ab includes switch transistor 712ab, LCD element 714ab and capacitor 716ab; and sub-pixel 710ac includes switch transistor 712ac, LCD element 714ac and capacitor 716ac.

The arrangement of the electrical components of each sub-pixel 710 will now be described with reference to sub-pixel 710*aa*. A control or gate terminal (g) of switch transistor 712*aa* is electrically connected to ROW A, a power or source terminal (s) of switch transistor 712*aa* is electrically connected to COLUMN A and a power or drain terminal (d) of switch transistor 712*aa* is electrically connected to a first electrode 724*aa* of LCD element 714*aa* and to a first electrode 724'*aa* of capacitor 716*aa*. A second electrode 717 of LCD element 714*aa* is connected to reference voltage G1. A second electrode 722*aa* of capacitor 716*aa* is connected to ROW B. The arrangement of the electrical components of sub-pixels 710*aa*, 710*ab* and 710*ac* is identical, except for their connections to their respective COLUMNs.

The operation of each sub-pixel 710 of pixel 700 will now be described with reference to sub-pixel 710*aa*. To activate LCD element 714*aa*, the voltage applied to COLUMN A is changed from first voltage 230 to second voltage 232. During application of second voltage 232 to COLUMN A, pulsed signal 234 is applied to ROW A and reference voltage G1 is applied to ROW B. Pulsed signal 234 causes switch transistors 712*aa* to conduct whereupon, subject to a voltage drop across transistor 712*aa*, second voltage 232 impressed on COLUMN A is impressed on first electrode 724*aa* of LCD element 714*aa* via drain terminal (d) of switch transistor 212*aa* thereby activating LCD element 714*aa*. Because capacitor 716*aa* is connected between drain terminal (d) of switch transistor 712*aa* and ROW B, when pulsed signal 234 is applied to ROW A, capacitor 716*aa* charges to the voltage impressed on COLUMN A, i.e., second voltage 232, minus any voltage drop across switch transistor 712*aa*.

Upon termination of pulsed signal 234 on ROW A, capacitor 716*aa* stores the voltage received from COLUMN A. Thereafter, capacitor 716*aa* impresses its stored voltage on the first electrode 724*aa* of LCD element 714*aa*, whereupon LCD element 714*aa* is held in an active, light emitting state in the absence of pulsed signal 234 on ROW A. Conversely, LCD element 714*aa* is turned off when pulsed signal 234 is applied on ROW A in the presence of first voltage 230, e.g., zero volts, on COLUMN A. More specifically, applying pulsed signal 234 to ROW A when first voltage 230 is applied to COLUMN A causes switch transistor 712*aa* to turn on, whereupon capacitor 716*aa* discharges through switch transistor 712*aa* thereby deactivating LCD element 714*aa*. Upon termination of pulsed signal 234, capacitor 716*aa* is charged to the voltage impressed on COLUMN A, i.e., first voltage 230, plus any voltage drop across switch transistor 212*aa*, whereupon LCD element 714*aa* is held in its inactive state even after pulsed signal 234 on ROW A is terminated and switch transistor 712*aa* is switched off thereby isolating LCD element 714*aa* and capacitor 716*aa* from ROW A.

In a like manner, LCD element 714*ab* can be turned on and off in response to the application of pulsed signal 234 on ROW A when second voltage 232 and first voltage 230, respectively, are applied to COLUMN B and reference voltage G1 is applied to ROW B; and LCD element 714*ac* can be turned on and off in response to the application of pulsed signal 234 on ROW A when second voltage 232 and first voltage 230, respectively, are applied to COLUMN C and reference voltage G1 is applied to ROW B. In practice, each of ROW A, ROW B, etc., is maintained at reference voltage G1 in the absence of pulsed signal 234 being applied thereto. Similarly, each of COLUMN A, COLUMN B, COLUMN C, etc., is held at first voltage 230, e.g., zero volts, in the absence of the application of second voltage 232, e.g., 10 volts, thereto.

Figure 8:
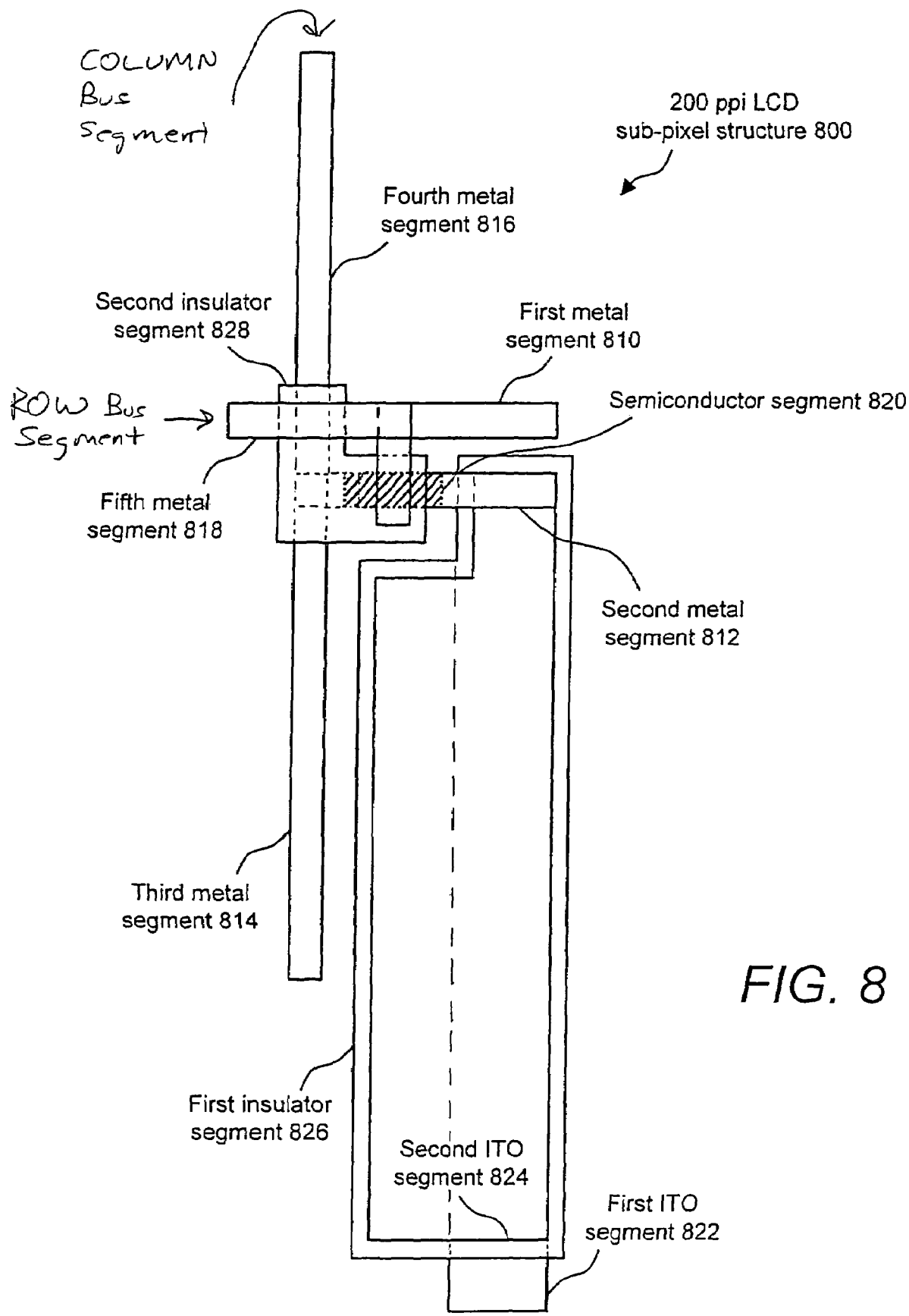
FIG. 8 is a plan view of an exemplary physical layout of one of sub-pixels of FIG. 7.

With reference to FIG. 8 and with continuing reference to FIG. 7, a sub-pixel structure 800 representative of the physical structure that forms each sub-pixel 710 of pixel 700 includes an elongated first metal segment 810, an elongated second metal segment 812, an elongated third metal segment 814, an L-shaped fourth metal segment 816, an L-shaped fifth metal segment 818, an elongated semiconductor segment 820, an elongated first ITO segment 822, an elongated second ITO segment 824, an elongated first insulator segment 826 and an L-shaped second insulator segment 828.

Metal segments 810, 812, 814, 816 and 818 are formed of any electrically conductive material that is suitable for depositing via a shadow mask deposition process, such as, without limitation, molybdenum (Mo), copper (Cu), nickel (Ni), chromium (Cr) or aluminum (Al). Semiconductor segment 820 is formed of a semiconductor material that is depositable via a shadow mask deposition process and which is suitable for forming a TFT by vacuum evaporation, such as, without limitation, cadmium selenide (CdSe), cadmium sulfide (CdS) or tellurium (Te). ITO segments 822 and 824 are formed of ITO. Insulator segments 826 and 828 are formed of any transparent, electrically non-conductive material that is suitable for depositing via a shadow mask deposition process, such as, without limitation, aluminum oxide ($Al_2O_3$) or silicon dioxide ($SiO_2$).

Semiconductor segment 820 is the current-carrying layer of switch transistor 712. The combination of fifth metal segment 818 overlapping first metal segment 810 in the manner shown in FIG. 8 forms a ROW bus segment and forms the gate terminal (g) of switch transistor 712. The combination of fourth metal segment 816 overlapping third metal segment 814 in the manner shown in FIG. 8 forms a COLUMN bus segment and forms the source terminal (s) of switch transistor 712. Second metal segment 812 forms the drain terminal (d) of switch transistor 712 and forms a contact with second ITO segment 824 which functions as both the first electrode 724 of LCD element 714 and the first electrode 724' of capacitor 716. First ITO segment 822 functions as the second electrode 722 of capacitor 716 which is connected to the next successive ROW bus. First insulator segment 826 electrically isolates first ITO segment 822 from second ITO segment 824 thereby functioning as the dielectric of capacitor 716. Second insulator segment 828 electrically isolates the combination of first metal segment 810 and fifth metal segment 818 from the combination of third metal segment 814 and fourth metal segment 816 thereby electrically isolating the ROW bus segment from the COLUMN bus segment. Second insulator segment 828 also serves as the gate dielectric of switch transistor 712.

Desirably, each segment 810-828 of each sub-pixel structure 800 is formed on a transparent substrate (not shown), such as a glass substrate or a color filter of the type typically used to form RED, GREEN and BLUE pixel regions in a liquid crystal display. Each segment of each sub-pixel structure 800 is formed by a shadow mask deposition process in a shadow mask deposition system, like shadow mask deposition system 100.

The formation of a functioning LCD pixel 700 can be completed by the placement of liquid crystal material 715 atop each sub-pixel structure 800 of LCD pixel 700 and, subsequently, the placement of one continuous film of ITO atop the liquid crystal material 715, whereupon, the liquid crystal material is sandwiched between the continuous ITO film (which may serve as a ground plane) and each sub-pixel structure 800. The continuous film of ITO functions as the opposite electrode of LCD element 714 with respect to the corresponding second ITO segment 824. The continuous film of ITO is represented in FIG. 7 by the reference number 717 associated with the second electrode of each LCD element 714. When a suitable electrical potential is applied between a second ITO segment 824 and the continuous film of ITO, the liquid crystal material 715 therebetween is activated.

Figure 9:
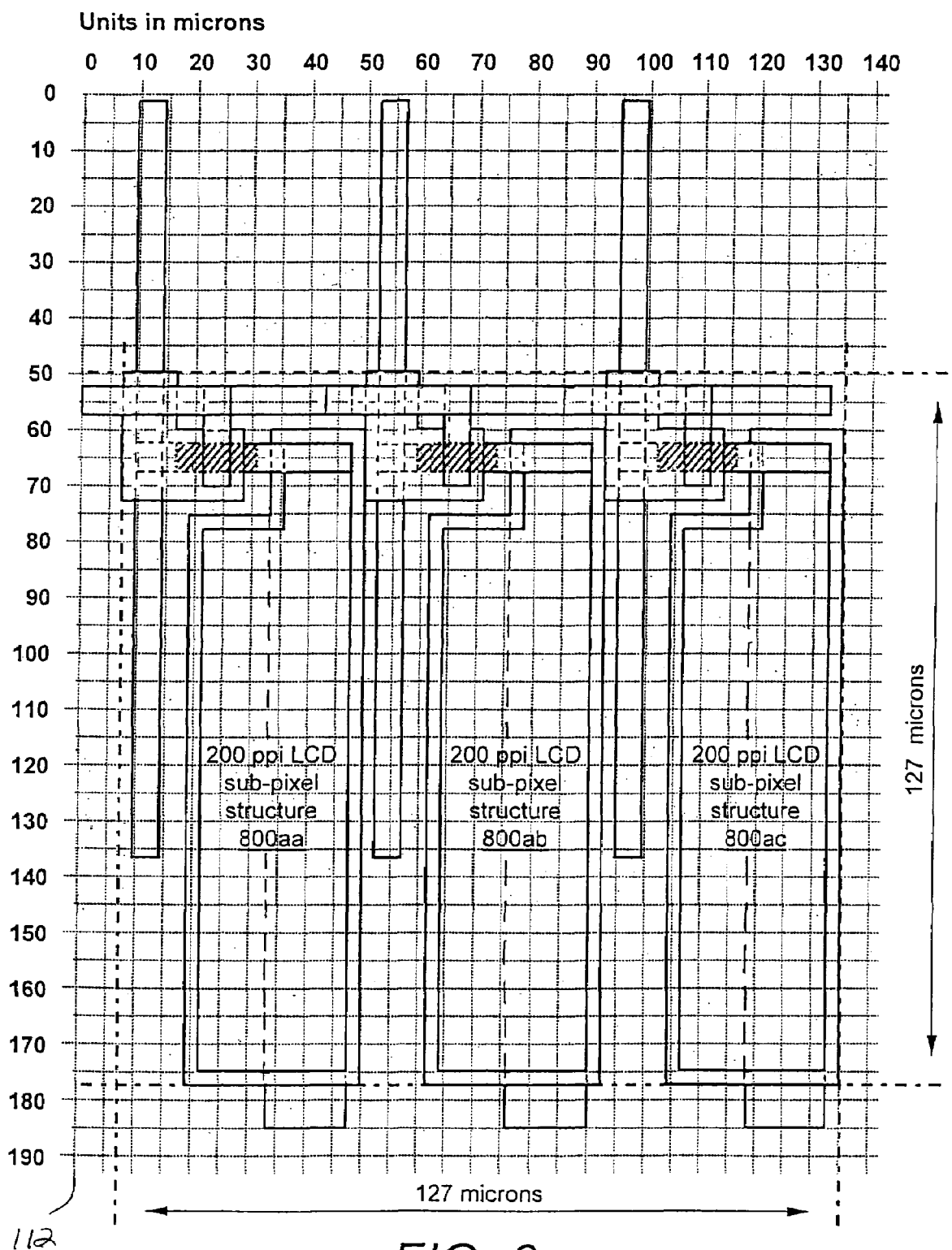
FIG. 9 is a plan view of an exemplary physical layout of the sub-pixels that form the LCD pixel of FIG. 7.

With reference to FIG. 9 and with continuing reference to FIGS. 7 and 8, a physical implementation of a 200 ppi LCD pixel structure 900 corresponding to the circuit schematic of 200 ppi LCD pixel 700 shown in FIG. 7, includes a 3×1 array of sub-pixel structures 800, i.e., sub-pixel structures 800aa, 800ab and 800ac.

Pixel structure 900 is shown on substrate 112. In FIG. 9, substrate 112 includes a grid which is shown only to indicate the general geometry, dimensions and relative placement of the individual segments of the 3×1 array of sub-pixel structures 800. Accordingly, the grid on substrate 112 in FIG. 9 is not to be construed as limiting the invention.

In one exemplary embodiment, the overall dimensions of pixel structure 900 is 127×127 microns and the overall dimension of each sub-pixel structure 800 is 127×42.33 microns. The geometry, dimensions and relative placement of the individual segments of each sub-pixel structure 800 is not limited to that shown in FIG. 9 and, subsequently, shown in FIGS. 10A through 10I, so long as the spacing from one pixel structure 900 to the next does not exceed 127 microns in the Y direction and 42.33 microns in the X direction. The foregoing dimensions of pixel structure 900 and sub-pixel structures 300, however, are exemplary only and are not to be construed as limiting the invention.

An exemplary, non-limiting sequence of depositions to form LCD pixel structure 900 will now be described with reference to FIGS. 10A-10I.

Figure 10A:
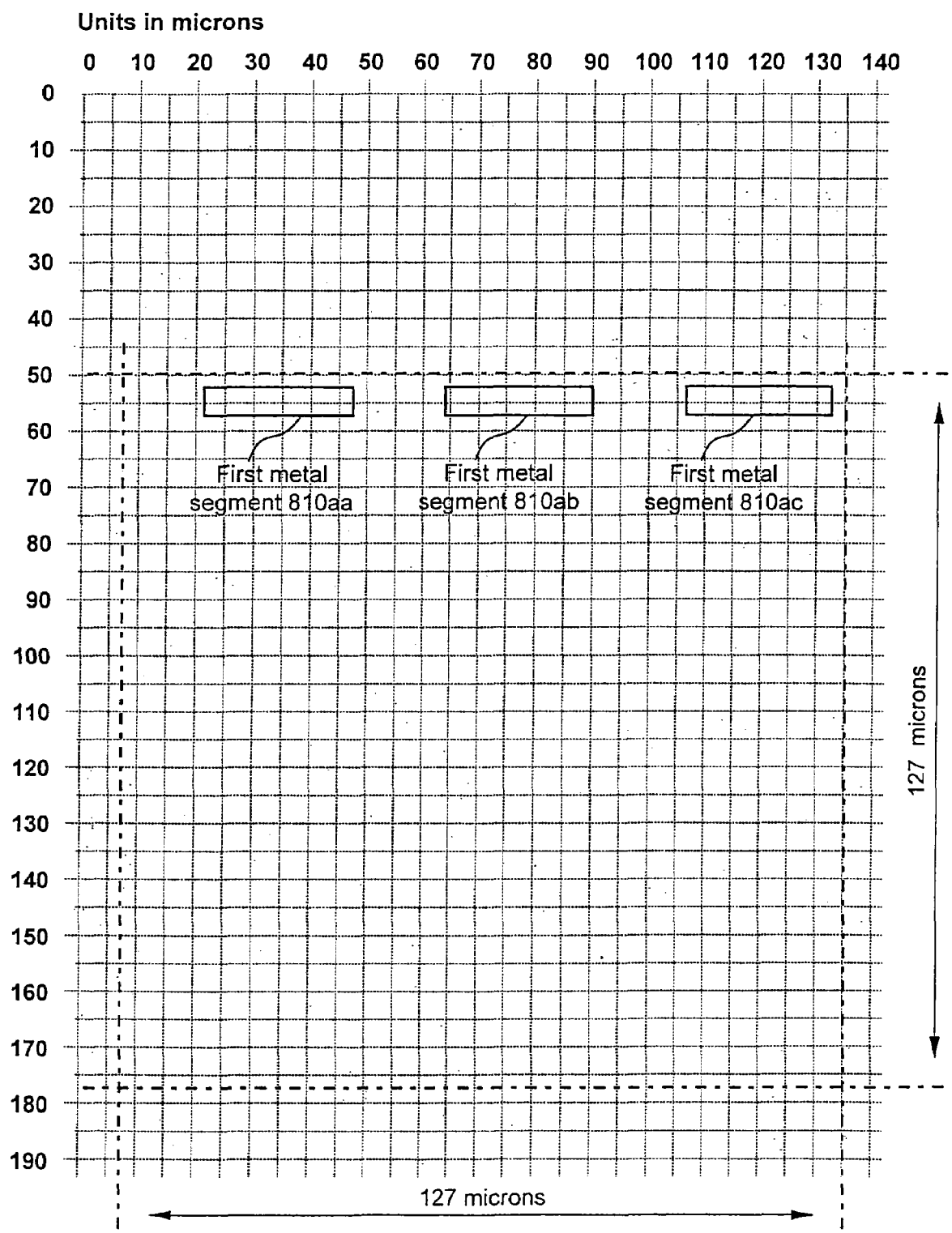
FIGS. 10A through 10I are plan views of exemplary successive depositions of the various segments that form the sub-pixels of FIG. 9.

With reference to FIG. 10A and with continuing reference to FIGS. 7-9, first metal segments 810aa, 810ab and 810ac are initially deposited on substrate 112 in shadow mask deposition system 100 by way of a shadow mask having a pattern of apertures of the same geometry, dimensions and spacing as said first metal segments.

Figure 10B:
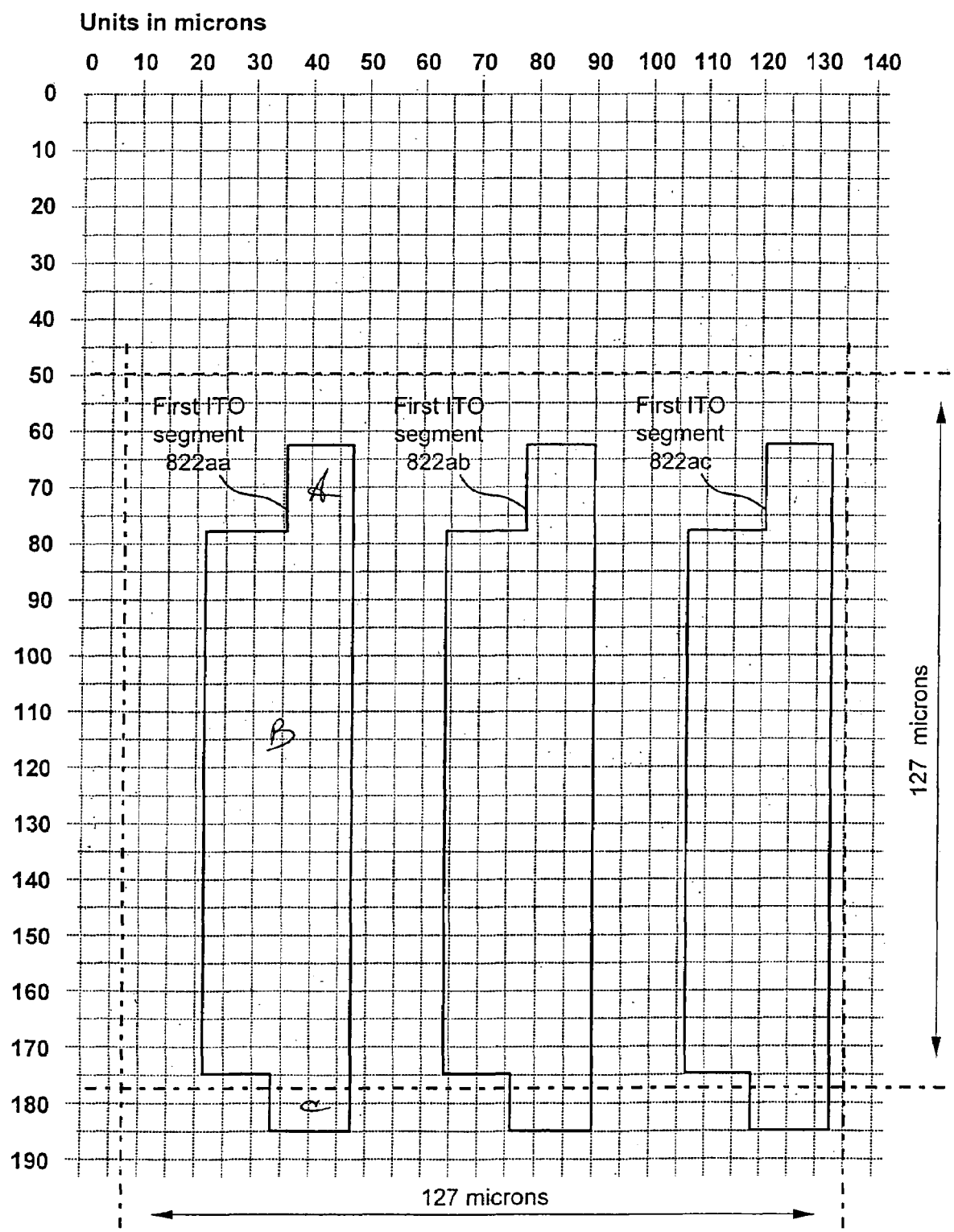

With reference to FIG. 10B and with continuing reference to FIGS. 7-10A, next, first ITO segments 822aa, 822ab and 822ac are deposited on substrate 112 in shadow mask deposition system 100 by way of a shadow mask having a pattern of apertures of the same geometry, dimensions and spacing as said first ITO segments.

Figure 10C:
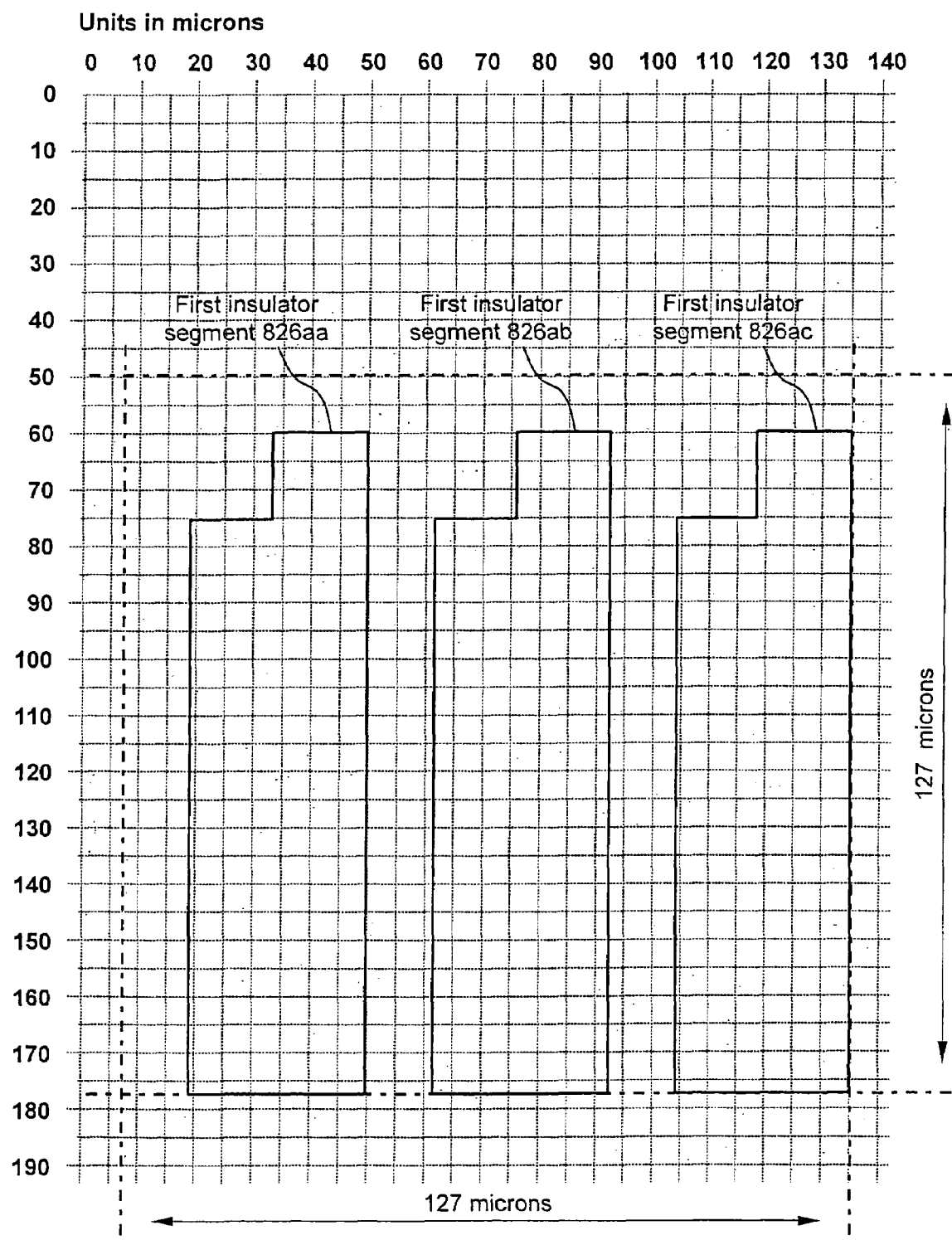

With reference to FIG. 10C and with continuing reference to FIGS. 7-10B, next, first insulator segments 826aa, 826ab and 826ac are deposited on substrate 112 in shadow mask deposition system 100 by way of a shadow mask having a pattern of apertures of the same geometry, dimensions and spacing as said first insulator segments.

Comparing FIGS. 10B and 10C, it can be seen that first insulator segments 826aa, 826ab and 826ac are deposited atop first ITO segments 822aa, 822ab and 822ac. More specifically, each first insulator segment 826 completely covers portions A and B of the corresponding first ITO segment 822. However, segment C of each first ITO segment 822 is not covered by the corresponding first insulator segment 826.

Figure 10D:
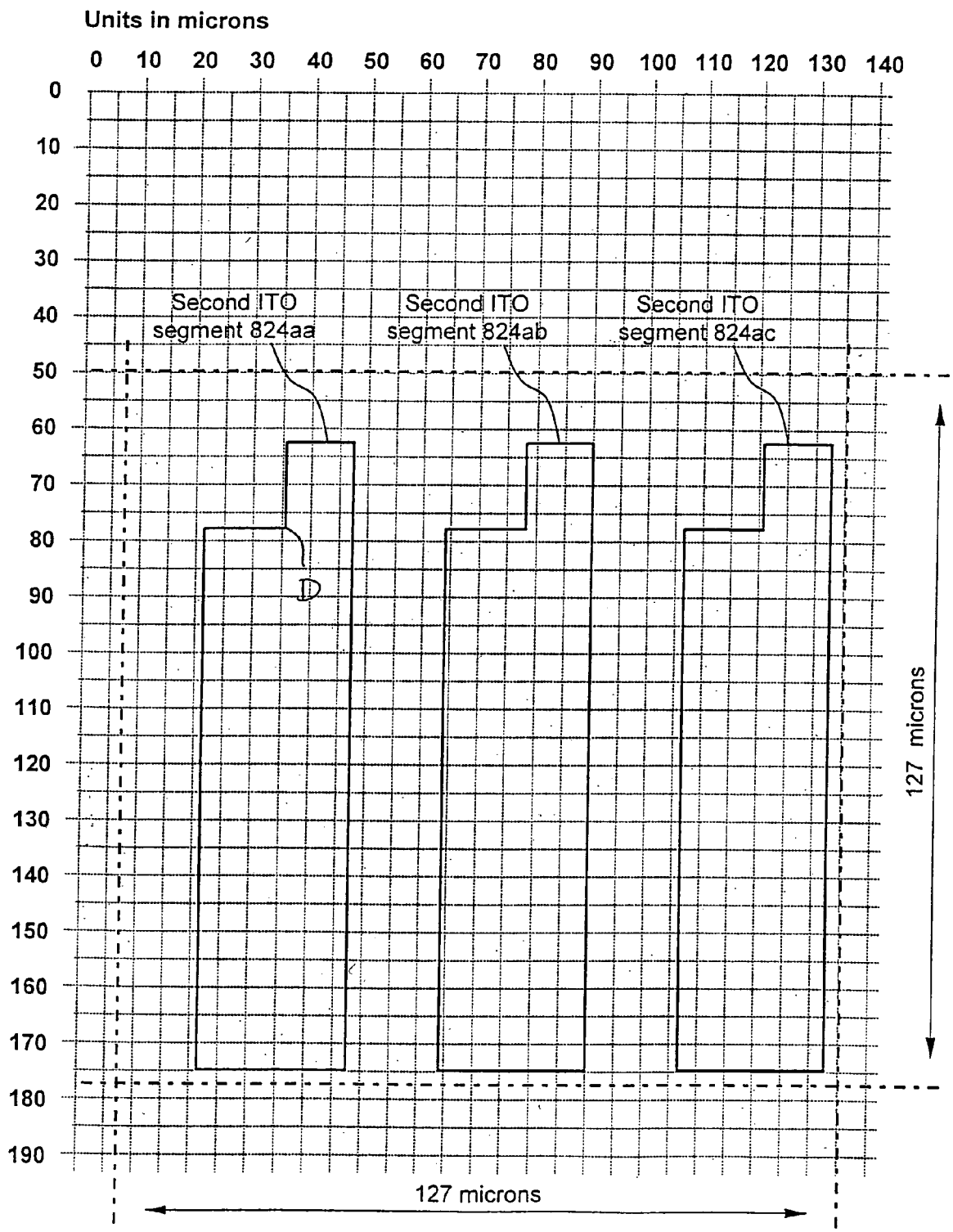

With reference to FIG. 10D and with continuing reference to FIGS. 7-10C, next, second ITO segments 824aa, 824ab and 824ac are deposited on substrate 112 in shadow mask deposition system 100 by way of a shadow mask having a pattern of apertures of the same geometry, dimensions and spacing as said second ITO segments.

Comparing FIGS. 10C and 10D, it can be seen that each second ITO segment 824 is deposited entirely atop of the corresponding first insulator segment 826 such that a portion of each first insulator segment 826 extends from beneath and around the periphery of the corresponding second ITO segment 824.

Figure 10E:
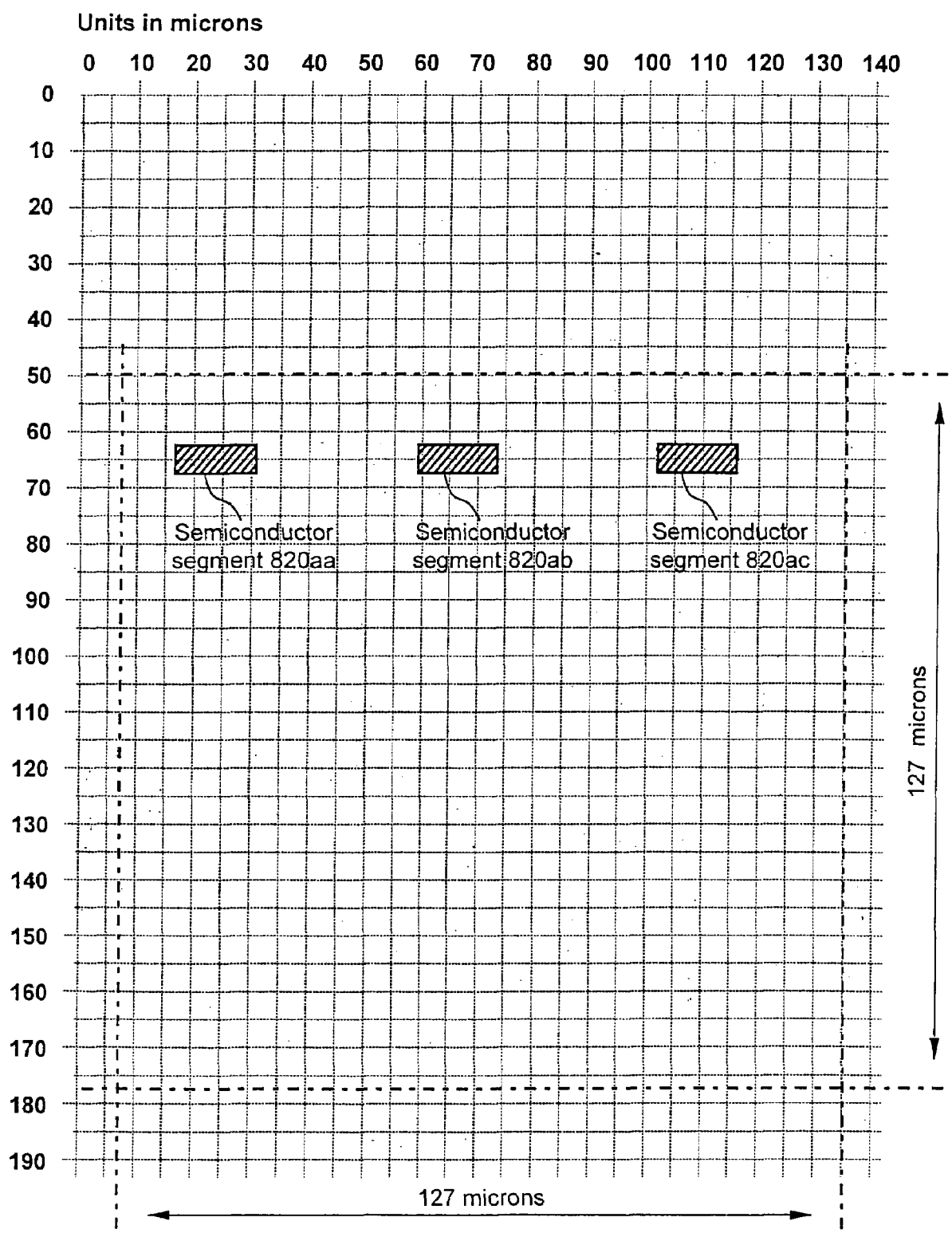

With reference to FIG. 10E and with continuing reference to FIGS. 7-10D, next, semiconductor segments 820aa, 820ab and 820ac are deposited on substrate 112 in shadow mask deposition system 100 by way of a shadow mask having a pattern of apertures of the same geometry, dimensions and spacing as said semiconductor segments. More specifically, each semiconductor segment 820 is deposited between a previously deposited first metal segment 810 and a corner D of a corresponding second ITO segment 824.

Figure 10F:
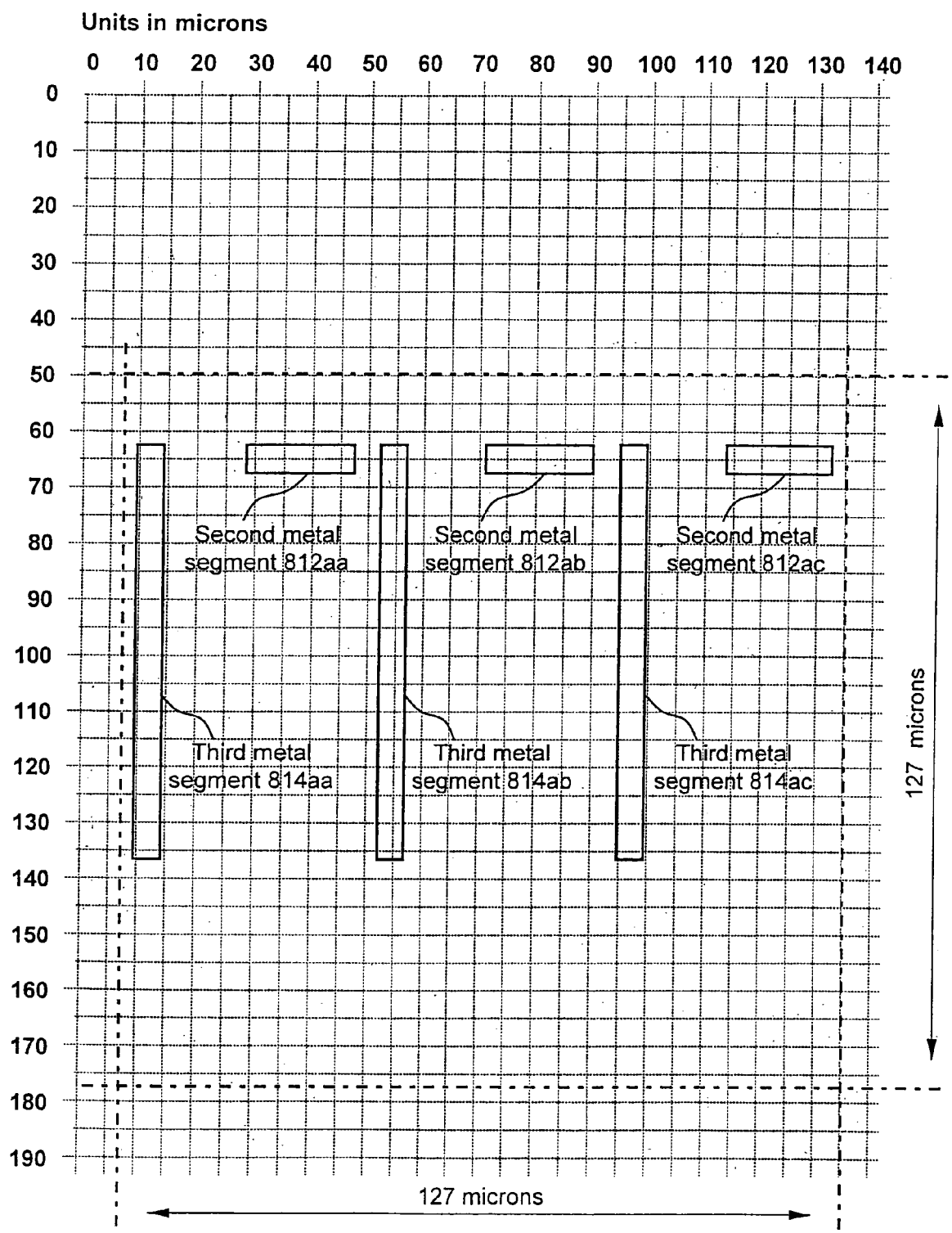

With reference to FIG. 10F and with continuing reference to FIGS. 7-10E, next, second metal segments 812aa, 812ab and 812ac along with third metal segments 814aa, 814ab and 814ac are deposited on substrate 112 in shadow mask deposition system 100 by way of a shadow mask having a pattern of apertures of the same geometry, dimensions and spacing as said second and third metal segments. Each second metal segment 812 is deposited overlapping the corresponding semiconductor segment 820 and the corresponding second ITO segment 824. Each third metal segment 814 is deposited adjacent a corresponding semiconductor segment 820 and second ITO segment 824.

Figure 10G:
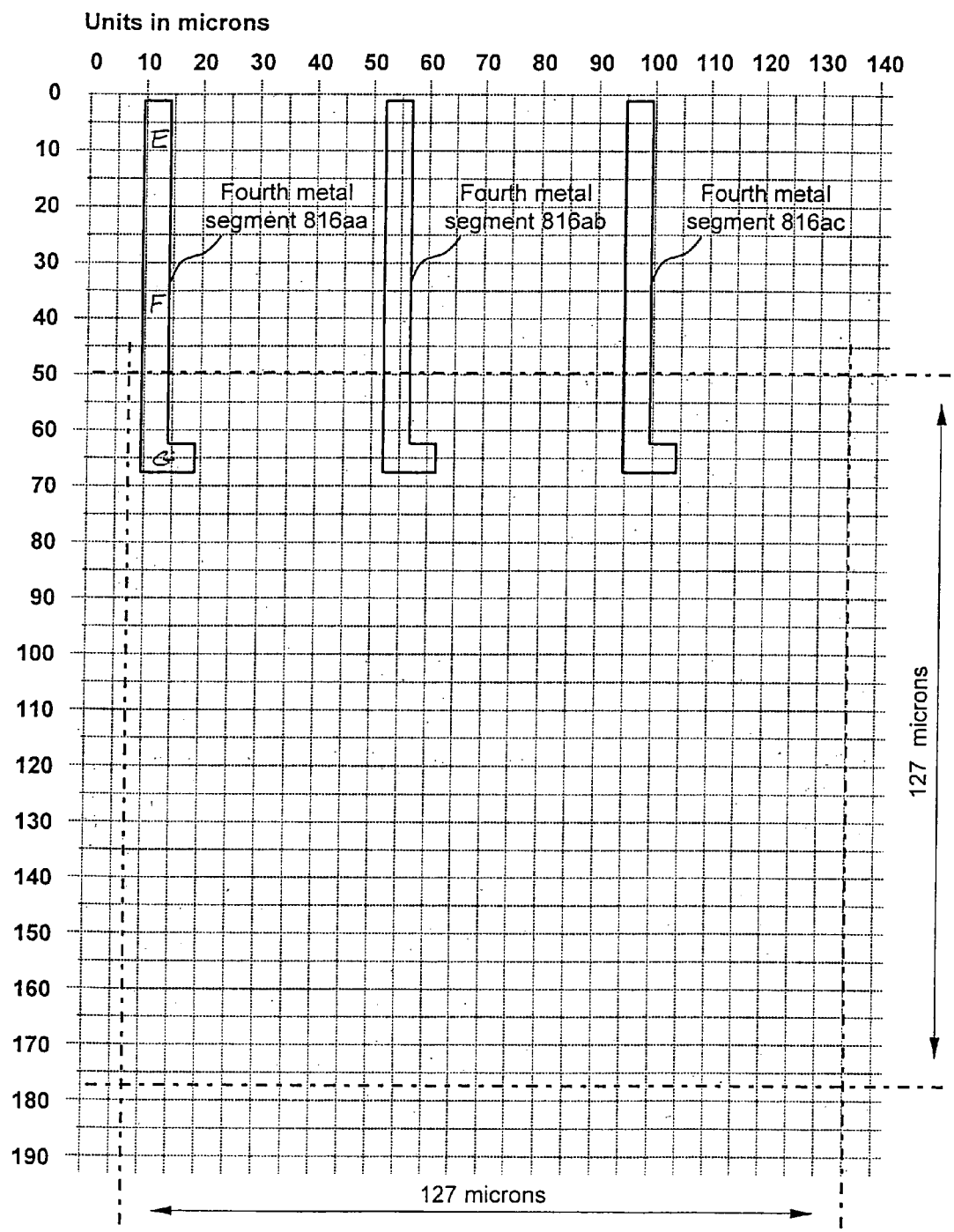

With reference to FIG. 10G and with continuing reference to FIGS. 7-10F, next, fourth metal segments 816aa, 816ab and 816ac are deposited on substrate 112 in shadow mask deposition system 100 by way of a shadow mask having a pattern of apertures of the same geometry, dimensions and spacing as said fourth metal segments. Each fourth metal segment 816 is deposited overlapping a corresponding third metal segment 814 and a corresponding semiconductor segment 820.

Figure 10H:
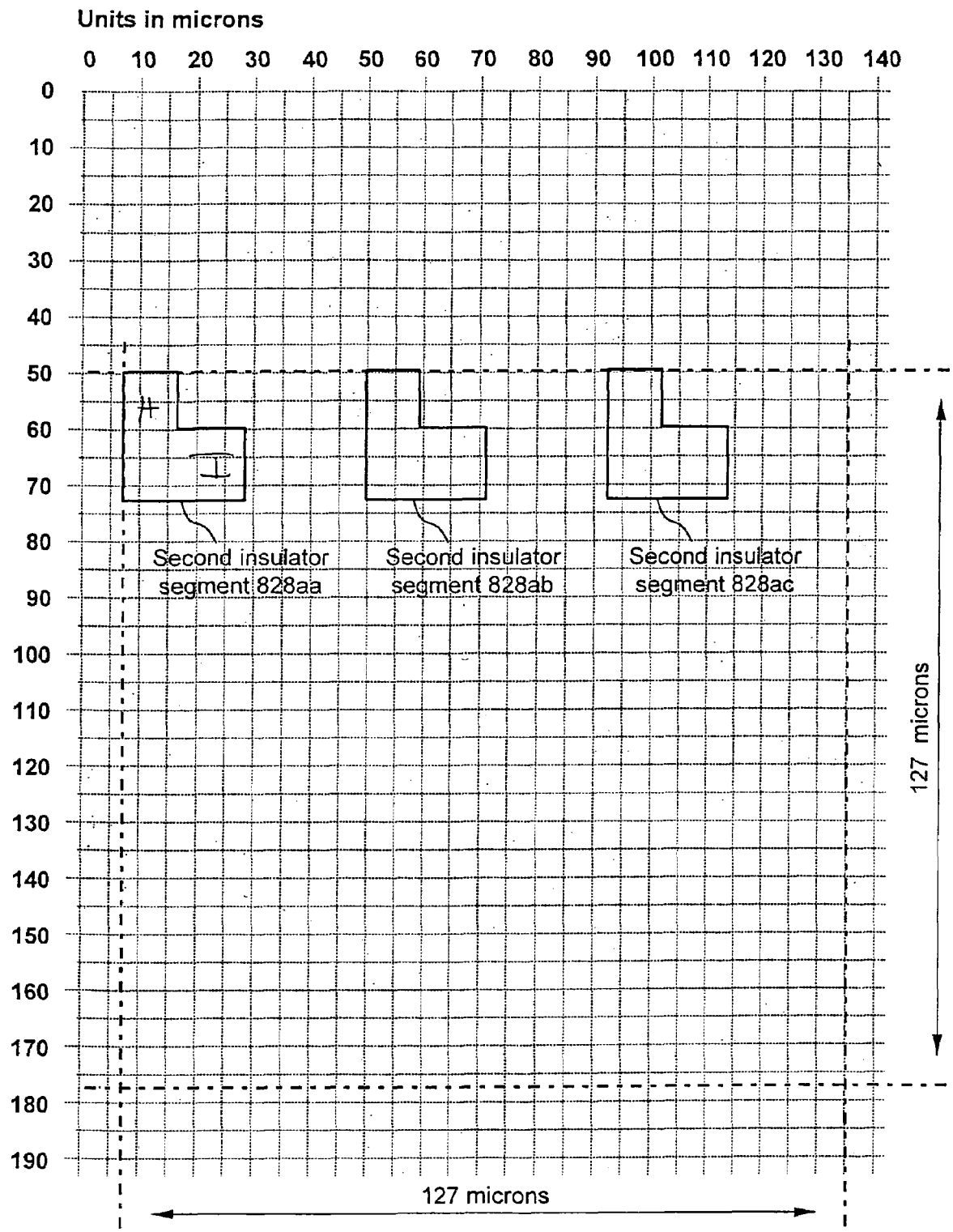

With reference to FIG. 10H and with continuing reference to FIGS. 7-10G, next, second insulator segments 828aa, 828ab and 828ac are deposited on substrate 112 in shadow mask deposition system 100 by way of a shadow mask having a pattern of apertures of the same geometry, dimensions and spacing as said second insulator segments. Each second insulator segment 828 is deposited such that portion E of the corresponding fourth metal segment 816 is not covered thereby while portions F and G of the corresponding fourth metal segment 816 along with the majority of the corresponding semiconductor segment 820 opposite second metal segment 812 are covered.

Figure 10I:
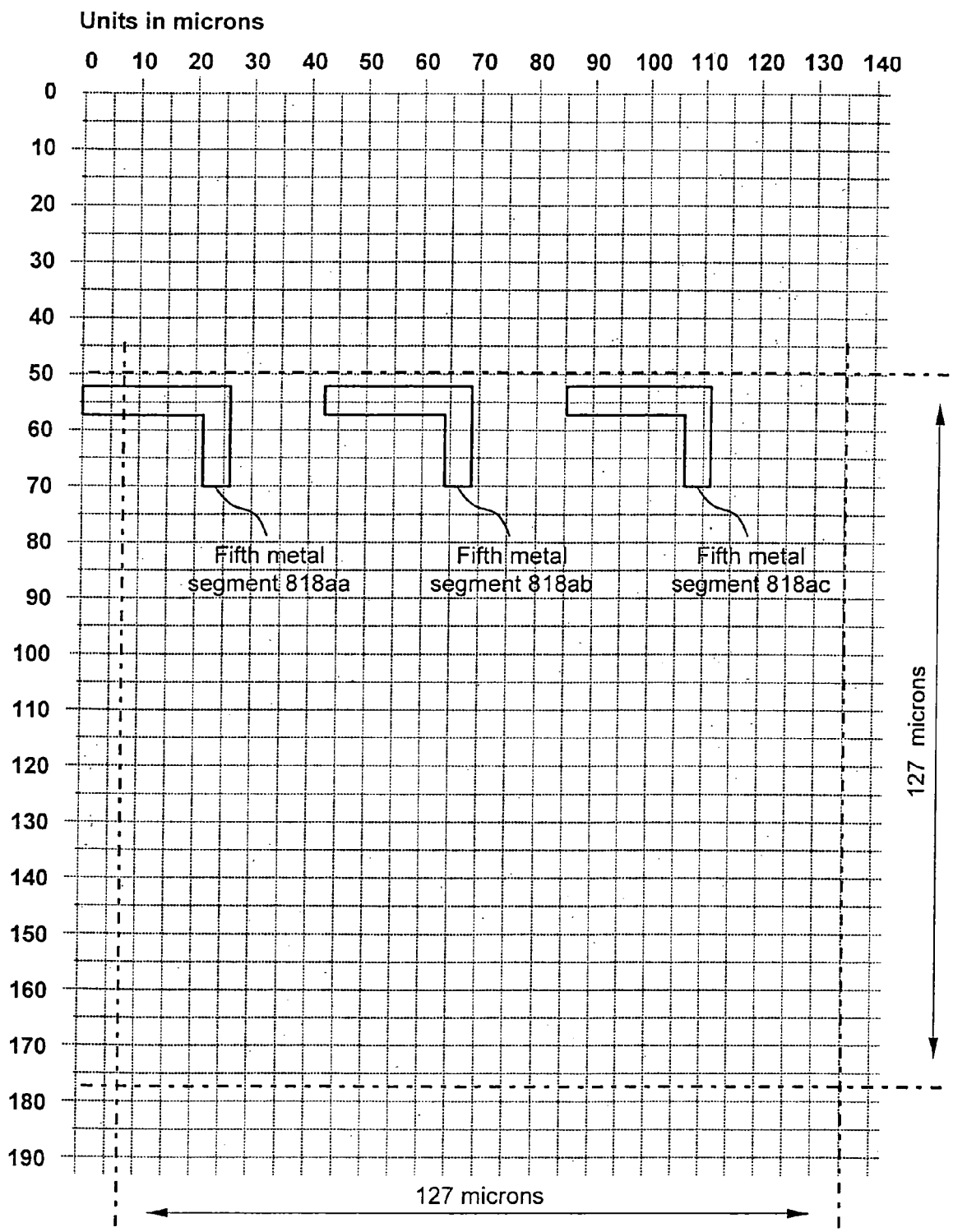

Lastly, with reference to FIG. 10I and with continuing reference to FIGS. 7-10H, fifth metal segments 818aa, 818ab and 818ac are deposited on substrate 112 in shadow mask deposition system 100 by way of a shadow mask having a pattern of apertures of the same geometry, dimensions and spacing as said fifth metal segments. Each fifth metal segment 818 is deposited overlapping an end of a corresponding first metal segment 810 adjacent corresponding semiconductor segment 820, and overlapping, but not completely covering, portions H and I of the corresponding second insulator segment 828.

Except for replacing the segments of sub-pixel structures 300 of LCD pixel structure 400 with those of sub-pixel structures 800 of LCD pixel structure 900, the method of forming a user-defined arrangement of pixel structures by use of a shadow mask deposition process is identical to that described in method 600 of FIG. 6.

For the reasons discussed above in connection with method 600, the number of deposition steps, the pattern of material deposited in each deposition step and the order of the deposition steps described above in connection with sub-pixel structures 800 of LCD pixel structure 900 are not to be construed as limiting the invention.

The present invention has been described with reference to the preferred embodiments. Obvious modifications and alterations will occur to others upon reading and understanding the preceding detailed description. For example, pulse signal 234 and second voltage 232 are illustrated as being positive voltages. However, this is not to be construed as limiting the invention since second voltage 232 can be a positive or negative voltage and pulsed signal 234 can be a positive or negative voltage depending upon whether the corresponding transistor is a PNP or NPN transistor. It is intended that the invention be construed as including all such modifications and alterations insofar as they come within the scope of the appended claims or the equivalents thereof.

The invention claimed is:

1. An LCD pixel formed from an array of LCD sub-pixels, each of which comprises:
   a capacitor formed of a stack of a pair of first conductors electrically isolated from each other by a first insulator;
   a transistor formed from a pair of spaced second conductors, one of which is in contact with one of the first conductors, a semiconductor material extending in contact between the pair of second conductors, a second insulator atop the semiconductor material and a third conductor atop the second insulator;
   a liquid crystal material atop the one first conductor and in direct contact therewith; and
   a fourth conductor atop the liquid crystal material and in direct contact therewith.

2. The LCD pixel of claim 1, further including a substrate formed of an insulator, wherein at least a portion of each of (i) the other of the first conductors, (ii) the second conductors and (iii) the semiconductor material is disposed on the substrate.

3. The LCD pixel of claim 1, wherein:
   each insulator is formed of a transparent, electrically non-conductive material; and
   each first conductor is formed of a transparent, electrically conductive material.

4. The LCD pixel of claim 3, wherein:
   each insulator is formed of aluminum oxide ($Al_2O_3$) or silicon dioxide ($SiO_2$);
   each first conductor and the fourth conductor is formed of indium-tin-oxide (ITO); and
   each conductor, other than each first conductor and the fourth conductor, is formed of copper (Cu), nickel (Ni), chromium (Cr) or aluminum (Al).

5. The LCD pixel of claim 1, further including a pair of spaced first conductive busses, wherein the third conductor is connected to one of said pair of first busses and the other first conductor is connected to the other of said pair of first busses.

6. The LCD pixel of claim 5, further including a second conductive bus disposed transverse to the pair of first busses and electrically isolated therefrom by the second insulator, wherein the other second conductor is connected to the second conductive bus.

7. A method of forming an LCD pixel comprising:
   (a) forming a capacitor comprised of a deposit of a first conductor, a deposit of a first insulator on the first conductor and a deposit of a second conductor on the first insulator;
   (b) depositing semiconductor material in spaced relation to the capacitor;
   (c) depositing a third conductor in a manner to form a connection between the second conductor and a first portion of the semiconductor material and to form at least part of a first bus that is connected to a second portion of the semiconductor material but not to the first portion of the semiconductor material;
   (d) depositing a second insulator on the semiconductor material and on the first bus;
   (e) depositing a fourth conductor on the second insulator, the deposited fourth conductor forming at least part of a second bus;
   (f) depositing a liquid crystal material on the second conductor in direct contact therewith; and
   (g) depositing a fifth conductor on the liquid crystal material in direct contact therewith.

8. The method of claim 7, wherein:
   the third conductor is comprised of a first metal segment that connects the first portion of the semiconductor material and the second conductor, and a second metal segment that defines the at least part of a first bus that is connected to a second portion of the semiconductor material; and
   the fourth conductor is comprised of a third metal segment.

9. The method of claim 8, wherein:
   the first bus is further comprised of a fourth metal segment in contact with the second metal segment; and
   the second bus is further comprised of a fifth metal segment in contact with the third metal segment.

10. The method of claim 7, wherein:
    the first and second conductors are each formed from a first conductive material;
    the first and second insulators are each formed from the same insulator material; and
    the third and fourth conductors are each formed from a second conductive material.

11. The method of claim 10, wherein:
    the first conductive material is indium-tin-oxide (ITO);
    the insulator material is aluminum oxide ($Al_2O_3$) or silicon dioxide ($SiO_2$); and
    the second conductive material is copper (Cu), nickel (Ni), chromium (Cr) or aluminum (Al).

12. An LCD pixel comprising:
    a capacitor formed on an insulating substrate, the capacitor including a first conductive segment on the substrate, a first insulator segment on the first conductive segment and a second conductive segment on the first insulator segment;
    a transistor formed on the substrate, the transistor including a semiconductor material segment on the substrate, a third conductive segment connecting a first part of the semiconductor material segment to the second conductive segment, a fourth conductive segment connected to a second part of the semiconductor material segment, a second insulator segment on the semiconductor material segment and a fifth conductive segment on the second insulator segment;
    a liquid crystal material on the second conductive segment in direct contact therewith; and
    a sixth conductive segment on the liquid crystal material in direct contact therewith.

13. The LCD pixel of claim 12, further including:
    a first bus connected to the fourth conductive segment; and
    a second bus connected to the fifth conductive segment, wherein the first and second busses are electrically isolated from each other.

14. The LCD pixel of claim 13, wherein the first and second busses are electrically isolated from each other by the second insulator segment.

15. The LCD pixel of claim 13, further including a third bus connected to the first conductive segment, wherein the third bus is parallel to the second bus and the third bus is electrically isolated from the first bus.

16. An LCD pixel comprising:
a first conductive segment connected to a first bus;
a first insulator segment on the first conductive segment;
a second conductive segment on the first insulator segment;
a liquid crystal material on the second conductive segment and in direct contact therewith;
a third conductive segment on the liquid crystal material and in direct contact therewith; and
a thin film transistor having a control terminal, a first power terminal and a second power terminal connected to a second bus, a third bus and the second conductive segment, respectively, wherein the first, second and third busses are electrically isolated from each other.

17. The LCD pixel of claim 16, wherein, in response to application of a signal on the second bus in the presence of a first reference voltage on the first bus, a second reference voltage on the third conductive segment and an applied voltage on the third bus, the thin film transistor is operative for (i) charging a capacitor formed by the combination of the first conductive segment, the first insulator segment and the second conductive segment from the applied voltage on the third bus and (ii) for activating the liquid crystal material from the applied voltage on the third bus.

18. The LCD pixel of claim 17, wherein, at least one of:
the first reference voltage is a ground reference;
the second reference voltage is the ground reference;
the applied voltage is either a positive or negative voltage with respect to the ground reference; and
the signal is either a positive or negative voltage pulse with respect to the ground reference.

* * * * *